US012256422B2

(12) United States Patent
Shaked et al.

(10) Patent No.: US 12,256,422 B2
(45) Date of Patent: Mar. 18, 2025

(54) AUTOMATIC GAIN CONTROL FOR SUPER-HIGH ORDER MODULATIONS

(71) Applicant: QUALCOMM Incorporated, San Diego, CA (US)

(72) Inventors: Ronen Shaked, Kfar Saba (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 393 days.

(21) Appl. No.: 17/745,616

(22) Filed: May 16, 2022

(65) Prior Publication Data

US 2023/0371059 A1   Nov. 16, 2023

(51) Int. Cl.
*H04W 72/542* (2023.01)
*H04L 5/00* (2006.01)
*H04W 24/00* (2009.01)
*H04W 24/02* (2009.01)
*H04W 52/52* (2009.01)
*H04W 72/20* (2023.01)

(52) U.S. Cl.
CPC ......... *H04W 72/542* (2023.01); *H04L 5/0051* (2013.01); *H04W 24/00* (2013.01); *H04W 24/02* (2013.01); *H04W 52/52* (2013.01); *H04W 72/20* (2023.01)

(58) Field of Classification Search
CPC ... H04W 72/542; H04W 52/52; H04W 72/20; H04W 24/02; H04W 24/00; H04L 5/0051
See application file for complete search history.

(56) References Cited

U.S. PATENT DOCUMENTS

| | | | |
|---|---|---|---|
| 11,882,072 B2* | 1/2024 | Lee | H04L 5/0048 |
| 2007/0109170 A1 | 5/2007 | Mori et al. | |
| 2016/0249398 A1 | 8/2016 | Yankevich et al. | |
| 2017/0086081 A1* | 3/2017 | Kim | H04W 4/027 |
| 2017/0257862 A1 | 9/2017 | Xue et al. | |
| 2020/0196339 A1* | 6/2020 | Jung | H04W 72/56 |
| 2023/0051117 A1* | 2/2023 | Tsai | H04L 5/0048 |
| 2023/0336305 A1* | 10/2023 | Hakola | H04L 27/2613 |
| 2023/0371059 A1* | 11/2023 | Shaked | H04L 5/0051 |

OTHER PUBLICATIONS

International Search Report and Written Opinion—PCT/US2023/066459—ISA/EPO—Aug. 8, 2023.

\* cited by examiner

*Primary Examiner* — Raj Jain
(74) *Attorney, Agent, or Firm* — Holland & Hart LLP

(57) ABSTRACT

Methods, systems, and devices for wireless communications are described. Generally, the described techniques provide for adapting or considering a receiver gain when using super-high order modulations for data transmissions. In one aspect, a network entity may transmit a tracking reference signal (TRS) in a first slot adjacent in time to a second slot allocated for one or more data transmissions associated with a high order modulation. A user equipment (UE) may receive the TRS and may adjust a receiver gain based on the TRS before receiving the one or more data transmissions associated with the high order modulation in the second slot. In another aspect, a UE may indicate (e.g., based on a receiver gain at the UE) a type of slot (e.g., shortened slot) or a maximum number of slots in which a network entity may transmit data transmissions with a high modulation order.

30 Claims, 19 Drawing Sheets

AUTOMATIC GAIN CONTROL FOR SUPER-HIGH ORDER MODULATIONS

FIELD OF TECHNOLOGY

The following relates to wireless communications, including automatic gain control for super-high order modulations.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM).

A wireless multiple-access communications system may include one or more network entities, each supporting wireless communication for communication devices, which may be known as user equipment (UE). Some wireless communications systems may support communications between network entities and UEs using various modulations, including super-high order modulations. Improved techniques for supporting communications using super-high order modulations may be desirable.

SUMMARY

The described techniques relate to improved methods, systems, devices, and apparatuses that support automatic gain control for super-high order modulations. Generally, the described techniques provide for adapting or considering a receiver gain when using super-high order modulations for data transmissions. In one aspect, a network entity may transmit a tracking reference signal (TRS) in a first slot adjacent in time to a second slot allocated for one or more data transmissions associated with a high order modulation. A UE may receive the TRS and may adjust a receiver gain based on the TRS before receiving the one or more data transmissions associated with the high order modulation in the second slot. As a result, the receiver gain at the UE may more accurately reflect current channel conditions and may not be based on an outdated calibration or automatic gain control setting using an old TRS. In another aspect, a UE may indicate (e.g., based on a receiver gain at the UE) a type of slot (e.g., shortened slot) or a maximum number of slots in which a network entity may transmit data transmissions with a high order modulation.

A method for wireless communication at a user equipment (UE) is described. The method may include receiving a control message scheduling one or more data transmissions associated with a modulation order that satisfies a threshold modulation order, monitoring a set of resources in a first slot for a tracking reference signal, where the first slot is adjacent in time to a second slot associated with the one or more data transmissions, and the set of resources is based on the modulation order, and receiving the one or more data transmissions in the second slot in accordance with the control message and based on the monitoring.

An apparatus for wireless communication at a UE is described. The apparatus may include a processor, memory coupled with the processor, and instructions stored in the memory. The instructions may be executable by the processor to cause the apparatus to receive a control message scheduling one or more data transmissions associated with a modulation order that satisfies a threshold modulation order, monitor a set of resources in a first slot for a tracking reference signal, where the first slot is adjacent in time to a second slot associated with the one or more data transmissions, and the set of resources is based on the modulation order, and receive the one or more data transmissions in the second slot in accordance with the control message and based on the monitoring.

Another apparatus for wireless communication at a UE is described. The apparatus may include means for receiving a control message scheduling one or more data transmissions associated with a modulation order that satisfies a threshold modulation order, means for monitoring a set of resources in a first slot for a tracking reference signal, where the first slot is adjacent in time to a second slot associated with the one or more data transmissions, and the set of resources is based on the modulation order, and means for receiving the one or more data transmissions in the second slot in accordance with the control message and based on the monitoring.

A non-transitory computer-readable medium storing code for wireless communication at a UE is described. The code may include instructions executable by a processor to receive a control message scheduling one or more data transmissions associated with a modulation order that satisfies a threshold modulation order, monitor a set of resources in a first slot for a tracking reference signal, where the first slot is adjacent in time to a second slot associated with the one or more data transmissions, and the set of resources is based on the modulation order, and receive the one or more data transmissions in the second slot in accordance with the control message and based on the monitoring.

Some examples of the method, apparatuses, and non-transitory computer-readable medium described herein may further include operations, features, means, or instructions for transmitting, based on a Doppler spread estimation at the UE or a speed of the UE satisfying a threshold, a request for the network entity to transmit the one or more data transmissions in one or more shortened slots, where the second slot includes a shortened slot. Some examples of the method, apparatuses, and non-transitory computer-readable medium described herein may further include operations, features, means, or instructions for transmitting an indication of a maximum quantity of continuous slots in which the network entity may be to transmit the one or more data transmissions associated with the modulation order that satisfies the threshold modulation order.

Some examples of the method, apparatuses, and non-transitory computer-readable medium described herein may further include operations, features, means, or instructions for identifying the maximum quantity of continuous slots based on a Doppler spread estimation at the UE, a speed of the UE, the modulation order associated with the one or more data transmissions, or a combination thereof. In some examples of the method, apparatuses, and non-transitory computer-readable medium described herein, the maximum quantity of continuous slots may be inversely proportional to the Doppler spread estimation at the UE, the speed of the UE, and the modulation order associated with the one or more data transmissions.

Some examples of the method, apparatuses, and non-transitory computer-readable medium described herein may further include operations, features, means, or instructions for monitoring a second set of resources in a third slot for the tracking reference signal, where a quantity of continuous slots between the second slot and the third slot may be less than or equal to the maximum quantity of continuous slots. In some examples of the method, apparatuses, and non-transitory computer-readable medium described herein, a signal-to-noise ratio of the one or more data transmissions satisfies a signal-to-noise ratio requirement, the signal-to-noise ratio requirement being based on channel fading losses and analog-to-digital conversion losses.

In some examples of the method, apparatuses, and non-transitory computer-readable medium described herein, the tracking reference signal includes a periodic tracking reference signal. Some examples of the method, apparatuses, and non-transitory computer-readable medium described herein may further include operations, features, means, or instructions for performing automatic gain control to adjust a receiver gain of the UE based on the monitoring, where the one or more data transmissions may be received in the second slot using the adjusted receiver gain.

A method for wireless communication at a network entity is described. The method may include transmitting a control message scheduling one or more data transmissions to a UE, the one or more data transmissions associated with a modulation order that satisfies a threshold modulation order, transmitting a tracking reference signal on a set of resources in a first slot, where the first slot is adjacent in time to a second slot associated with the one or more data transmissions, and the set of resources is based on the modulation order, and transmitting the one or more data transmissions in the second slot in accordance with the control message and based on transmitting the tracking reference signal in the first slot.

An apparatus for wireless communication at a network entity is described. The apparatus may include a processor, memory coupled with the processor, and instructions stored in the memory. The instructions may be executable by the processor to cause the apparatus to transmit a control message scheduling one or more data transmissions to a UE, the one or more data transmissions associated with a modulation order that satisfies a threshold modulation order, transmit a tracking reference signal on a set of resources in a first slot, where the first slot is adjacent in time to a second slot associated with the one or more data transmissions, and the set of resources is based on the modulation order, and transmit the one or more data transmissions in the second slot in accordance with the control message and based on transmitting the tracking reference signal in the first slot.

Another apparatus for wireless communication at a network entity is described. The apparatus may include means for transmitting a control message scheduling one or more data transmissions to a UE, the one or more data transmissions associated with a modulation order that satisfies a threshold modulation order, means for transmitting a tracking reference signal on a set of resources in a first slot, where the first slot is adjacent in time to a second slot associated with the one or more data transmissions, and the set of resources is based on the modulation order, and means for transmitting the one or more data transmissions in the second slot in accordance with the control message and based on transmitting the tracking reference signal in the first slot.

A non-transitory computer-readable medium storing code for wireless communication at a network entity is described. The code may include instructions executable by a processor to transmit a control message scheduling one or more data transmissions to a UE, the one or more data transmissions associated with a modulation order that satisfies a threshold modulation order, transmit a tracking reference signal on a set of resources in a first slot, where the first slot is adjacent in time to a second slot associated with the one or more data transmissions, and the set of resources is based on the modulation order, and transmit the one or more data transmissions in the second slot in accordance with the control message and based on transmitting the tracking reference signal in the first slot.

Some examples of the method, apparatuses, and non-transitory computer-readable medium described herein may further include operations, features, means, or instructions for receiving, from the UE, a request for the network entity to transmit the one or more data transmissions in one or more shortened slots, where the second slot includes a shortened slot. Some examples of the method, apparatuses, and non-transitory computer-readable medium described herein may further include operations, features, means, or instructions for receiving, from the UE, an indication of a maximum quantity of continuous slots in which the network entity may be to transmit the one or more data transmissions associated with the modulation order that satisfies the threshold modulation order.

Some examples of the method, apparatuses, and non-transitory computer-readable medium described herein may further include operations, features, means, or instructions for transmitting the tracking reference signal on a second set of resources in a third slot, where a quantity of continuous slots between the second slot and the third slot may be less than or equal to the maximum quantity of continuous slots. In some examples of the method, apparatuses, and non-transitory computer-readable medium described herein, a signal-to-noise ratio of the one or more data transmissions satisfies a signal-to-noise ratio requirement, the signal-to-noise ratio requirement being based on channel fading losses and analog-to-digital conversion losses. In some examples of the method, apparatuses, and non-transitory computer-readable medium described herein, the tracking reference signal includes a periodic tracking reference signal.

DETAILED DESCRIPTION

Figure 1:
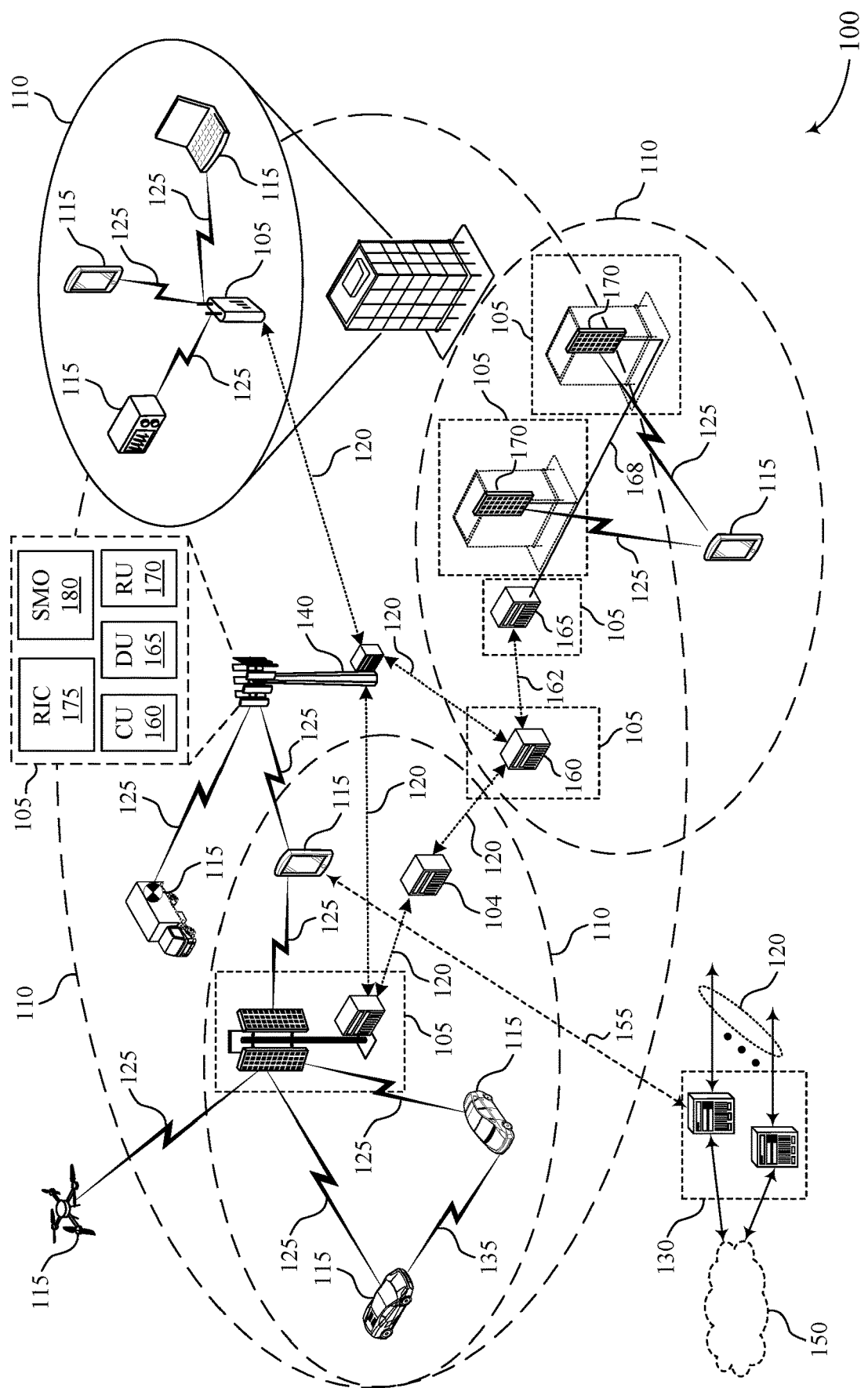
FIG. 1 illustrates an example of a wireless communications system that supports automatic gain control for super-high order modulations in accordance with one or more aspects of the present disclosure.

Some wireless communications systems may support communications between network entities and user equipments (UEs) using various modulations, including super-high order modulations. Modulation may refer to the process of varying properties of a signal (e.g., phase, frequency, or amplitude) to carry information, and a modulation may define the number of bits of information that can be carried in a time resource (e.g., a slot). A modulation may also refer to a modulation order or a modulation and coding scheme (MCS). Super-high order modulations may allow for a large number of bits of information to be carried in a time resource which may provide a significant increase in throughput (e.g., 25%, 50%, or 75%) over lower modulation orders. Some examples of super-high order modulations include 1024 quadrature amplitude modulation (QAM), 4096-QAM, and even 16,384-QAM. In some examples, a super-high order modulation may refer to a modulation order greater than a threshold (e.g., 1024-QAM modulation or greater).

In some cases, it may not be feasible to use super high modulations for communications between network entities and UEs. In particular, super high modulations may rely on smaller and more subtle signal variations to convey more information, and it may be challenging for a receiver to identify these variations (e.g., especially in noisy channels). In one example, a modulation order may be limited due to radio frequency noise impairments. Further, even if these radio frequency noise impairments are removed (e.g., using an advanced iterative receiver), analog-to-digital converter (ADC) limitations may also limit the modulation orders available for communications between network entities and UEs. Specifically, the dynamic range of an ADC may be shown to be too limiting in fading channels to support super-high order modulations.

The dynamic range of an ADC may correspond to a range of input signal levels for which the ADC may convert an analog signal to a digital signal. To improve the chances that the input signal level remains within the dynamic range of the ADC, an automatic gain controller (AGC) may control the received signal level of a signal passed to the ADC. The AGC may identify a gain (e.g., a level of amplification) to use to adjust signal levels to ensure that the signal level of a signal passed to the ADC remains within the dynamic range of the ADC. In some cases, if the AGC identifies the gain based on an outdated reference signal (e.g., an old tracking reference signal (TRS)), the gain may not be suitable for adjusting the signal levels of current signals. For instance, the gain may be too high and signal levels may be overamplified, which may lead to clipping at the ADC if the signal levels are outside the dynamic range of the ADC. Alternatively, the AGC may overcompensate for increases in signal levels and the gain may be too low, which may lead to a low signal-to-noise ratio (SNR) that may not be tolerable for super-high order modulations.

As described herein, a wireless communications system may support efficient techniques for supporting super-high order modulations given the limitations of an ADC. In one aspect, a network entity may transmit a tracking reference signal (TRS) in a first slot adjacent in time to a second slot allocated for one or more data transmissions associated with a high order modulation. A UE may receive the TRS and may adjust a receiver gain based on the TRS before receiving the one or more data transmissions associated with the high order modulation in the second slot. As a result, the receiver gain at the UE may more accurately reflect current channel conditions and may not be overly restricted based on an outdated calibration or automatic gain control setting using an old TRS. In another aspect, a UE may indicate (e.g., based on a receiver gain at the UE) a type of slot (e.g., shortened slot) or a maximum number of slots in which a network entity may transmit data transmissions with a high order modulation.

Aspects of the disclosure are initially described in the context of wireless communications systems. Examples of processes and signaling exchanges that support automatic gain control for super-high order modulations are then described. Aspects of the disclosure are further illustrated by and described with reference to apparatus diagrams, system diagrams, and flowcharts that relate to automatic gain control for super-high order modulations.

FIG. 1 illustrates an example of a wireless communications system 100 that supports automatic gain control for super-high order modulations in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending upon which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support automatic gain control for super-high order modulations as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be positioned according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115 (e.g., in a physical downlink control channel (PDCCH) or a physical downlink shared channel (PDSCH)), uplink transmissions (e.g., return link transmissions) from a UE 115 to a network entity 105 (e.g., in a physical uplink control channel (PUCCH) or a physical uplink shared channel (PUSCH)), or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications over a particular carrier bandwidth or may be configurable to support communications over one of a set of carrier bandwidths. In some examples, the wireless communications system 100 may include network entities 105 or UEs 115 that support concurrent communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, for example, refer to a sampling period of $T_s=1/$ ($\Delta f_{max} \cdot N_f$) seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The wireless communications system 100 may be a packet-based network that operates according to a layered protocol stack. In the user plane, communications at the bearer or PDCP layer may be IP-based. An RLC layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a network entity 105 or a core network 130 supporting radio bearers for user plane data. At the PHY layer, transport channels may be mapped to physical channels.

In some wireless communications systems (e.g., NR), modulation schemes may be limited to 256-QAM due to radio frequency noise impairments. Radio frequency noise impairments include phase noise, power amplifier non-linearity, and in-phase (I) and quadrature (Q) (IQ) imbalance. These radio frequency noise impairments may be tuned and calibrated in a network entity 105 or UE 115 to be sufficiently low for proper decoding of a highest modulation order of 256 QAM, but not for higher modulation orders. In some cases, these radio frequency noise impairments may be removed by an advanced iterative receiver. Thus, it may be feasible to support super super-high order modulations, such as 1024-QAM, 4096-QAM, and even 16384-QAM. Such super-high order modulations may provide a significant increase in throughput (e.g., 25%, 50%, or 75%). However, even when radio frequency noise impairments are removed, there may still be another SNR limiting component for super-high order modulations—the ADC. More specifically, in order to support such super-high order modulations, the dynamic range of an ADC may be shown to be too limiting in fading channels.

Figure 2:
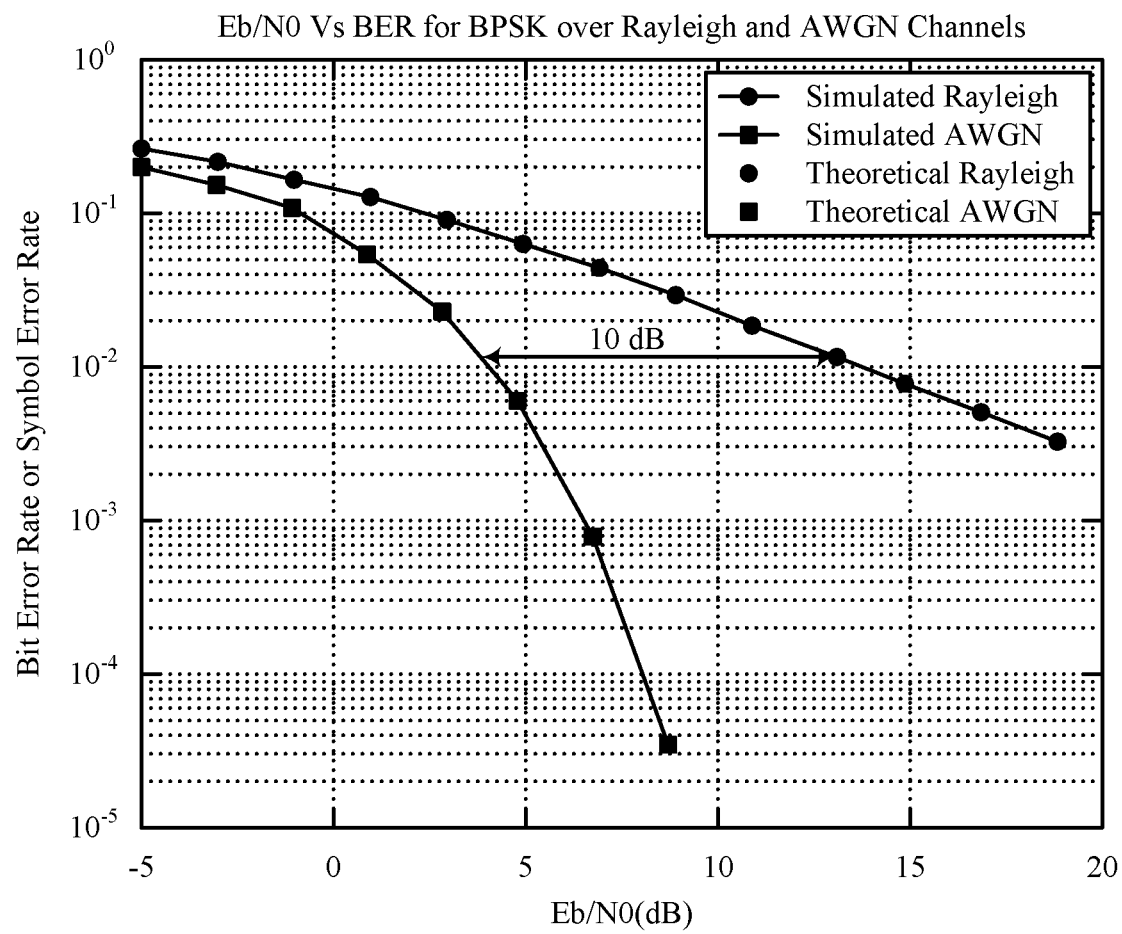
FIG. 2 illustrates an example of a graph of an energy to bit ($E_b$) to noise power spectral density ($N_0$) ratio versus bit error rate (BER) for an additive white gaussian noise (AWGN) channel and a Rayleigh fading channel in accordance with one or more aspects of the present disclosure.

The wireless communications system 100 may support efficient techniques for supporting super-high order modulations given the limitations of an ADC. For instance, standard waveforms may be modified to solve the dynamic range problem for super-high order modulations, thereby enabling super-high order modulations. In one aspect, a network entity 105 may transmit a TRS in a first slot adjacent in time to a second slot allocated for one or more data transmissions associated with a high order modulation. A UE 115 may receive the TRS and may adjust a receiver gain based on the TRS before receiving the one or more data transmissions associated with the high order modulation in the second slot. As a result, the receiver gain at the UE 115 may more accurately reflect current channel conditions and may not be overly restricted based on an outdated calibration or automatic gain control setting using an old TRS. In another aspect, a UE 115 may indicate (e.g., based on a receiver gain at the UE) a type of slot (e.g., shortened slot) or a maximum number of slots in which a network entity 105 may transmit data transmissions with a high order modulation FIG. 2 illustrates an example of a graph 200 of an energy to bit ($E_b$) to noise power spectral density ($N_0$) ratio versus bit error rate (BER) for an additive white gaussian noise (AWGN) channel and a Rayleigh fading channel in accordance with one or more aspects of the present disclosure. The $E_b$ to $N_0$ ratio ($E_b/N_0$) may also be referred to as a normalized measure of SNR. The graph 200 shows that the BER or symbol error rate decreases as $E_b/N_0$ increases, and the graph 200 may be used to determine a required SNR for a given modulation (e.g., such that a BER is below a threshold). Table 1 shows estimates of the required SNRs for super-high order modulations.

TABLE 1

Estimates of the required SNRs for super-high order modulations

| Modulation | Shannon Bound (dB) | Required SNR in an AWGN channel (dB) | Required SNR in a fading channel (dB) |
|---|---|---|---|
| 1K-QAM | 30 | 35 | 45 |
| 2K-QAM | 33 | 38 | 48 |
| 4K-QAM | 36 | 41 | 51 |
| 8K-QAM | 39 | 44 | 54 |
| 16K-QAM | 42 | 47 | 57 |

In some cases, the required SNR for each modulation may be compared to a potential signal to quantization noise ratio (SQNR) of an ADC to determine whether the modulation may be supported (i.e., whether the required SNR of the modulation may be achieved). The SQNR provided by an ADC may be given by Equation 1.

$$\text{SQNR[dB]} = 4.76 + 6*Enob - \text{BackOff} + 10\log_{10}(\text{Oversampling}) \quad (1)$$

Enob may refer to a number of bits used to digitize a signal, and the BackOff may refer to a backoff from a receiver gain to avoid clipping at the ADC. The backoff from the receiver gain may include a backoff for a peak-to-average power ratio (PAPR) and a backoff due to channel up-fade. Channel up-fade may refer to an increase in signal power of an input signal into an AGC. Substituting values in Equation 1 may reveal the quantization noise floor (SQNR) of an ADC. For instance, ignoring the gain from oversampling (e.g., assuming 0 dB gain from oversampling), assuming an Enob of 12 bits, and assuming a BackOff of 22 dB (e.g., 12 dB for PAPR and 10 dB for a channel up-fade), the potential SQNR of an ADC may be 54.76 dB. Thus, in accordance with Table 1, a receiving UE 115 may not support a 16K-QAM modulation (e.g., since an ADC at the receiving UE 115 may not achieve the required SNR of 57).

Table 2 shows estimates of the required SNRs for super-high order modulations with a maximal (10 dB) fade margin applied. The fade margin may refer to a margin for channel up-fade and may correspond to the backoff used to accommodate channel up-fade in Equation 1. Table 2 also shows estimates of losses for super-high order modulations.

TABLE 2

Estimates of the required SNRs and losses for super-high order modulations

| Modulation | Shannon Bound (dB) | Required SNR in an AWGN channel (dB) | Required SNR in a fading channel (dB) | Net SNR post ADC quantization (dB) | Required SNR in fading channel & ADC quantization (dB) | Loss (dB) |
|---|---|---|---|---|---|---|
| 1K-QAM | 30 | 35 | 45 | 44.5 | 45.5 | 0.5 |
| 2K-QAM | 33 | 38 | 48 | 47.2 | 49 | 1 |
| 4K-QAM | 36 | 41 | 51 | 49.5 | 53.4 | 2.4 |
| 8K-QAM | 39 | 44 | 54 | 51.3 | 61.9 | 7.9 |
| 16K-QAM | 42 | 47 | 57 | 52.7 | Not possible. Stuck at 54.76 dB ADC floor | Infinity |

Evidently, the incurred penalty on a required SNR in a fading channel may become a significant challenge, with 16K-QAM even becoming non-operable.

The techniques described herein provide for avoiding these incurred high losses and even non-operable 16K-QAM due to the fade margin. If the backoff from an ADC due to up-fade (e.g., set to 10 dB in most cases) may be reduced, then the noise floor of the ADC may be improved (e.g., SQNR improves or increases). Thus, it may be appropriate to consider more exact values for a channel up-fade (e.g., consider the fading process of a channel) in determining a backoff for a receiver gain (e.g., to minimize the backoff and maximize SNR while avoiding clipping at an ADC). Such a consideration of a fading process of a channel may be affected by a Doppler spread in the channel. Table 3 shows the Doppler spread at a carrier of $f_{carrier} = 3.6$ GHz.

TABLE 3

Doppler spreads for different speeds

| Speed [Km/h] | Doppler Spread [Hz] |
|---|---|
| 3 | 10 |
| 30 | 100 |
| 60 | 200 |
| 90 | 300 |

The Doppler spread can also be given by Equation 2.

$$\text{Doppler spread: } f_d[\text{Hz}] = \frac{v}{c} f_{carrier} \quad (2)$$

Figure 3:
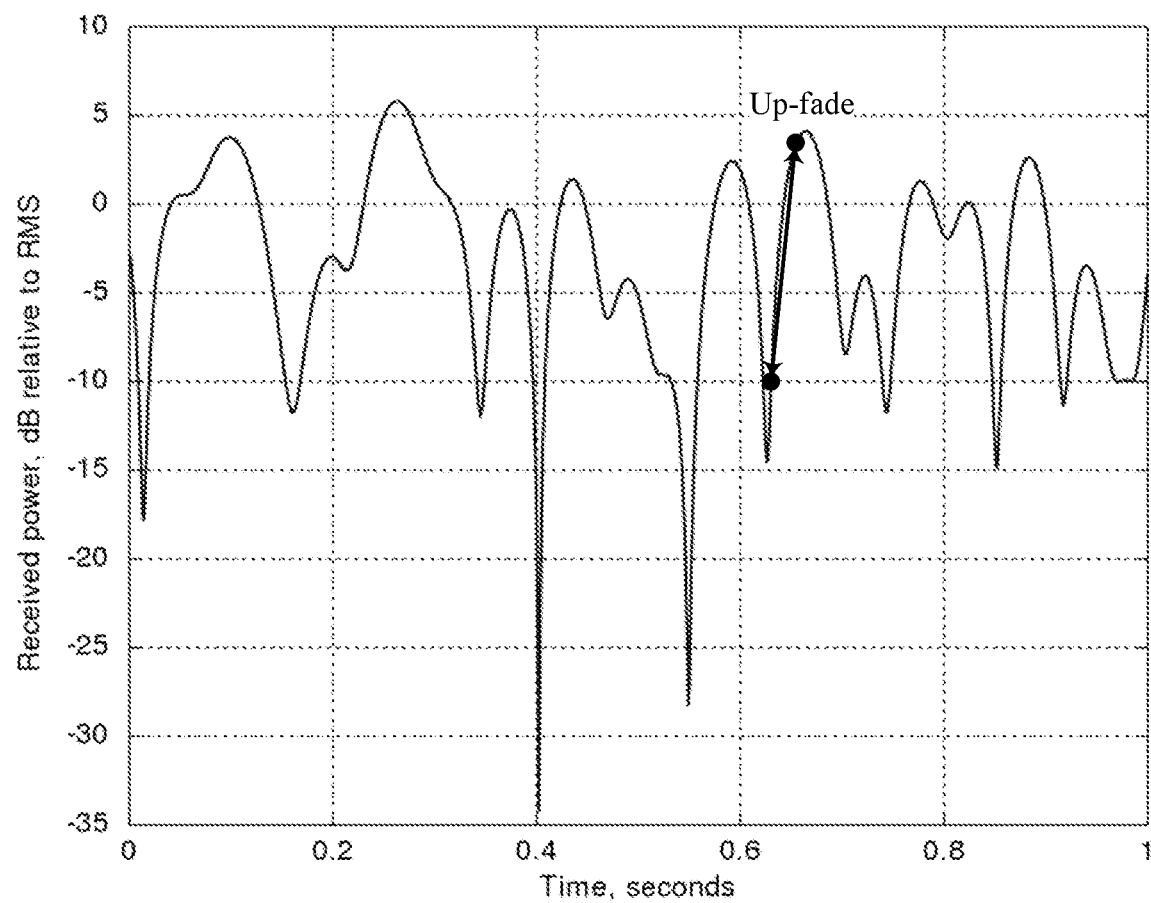
FIG. 3 illustrates an example of a representative realization of a Rayleigh fading channel for a Doppler spread of $f_d=10$ Hz in accordance with one or more aspects of the present disclosure.

FIG. 3 illustrates an example of a representative realization of a Rayleigh fading channel 300 for a Doppler spread of $f_d=10$ Hz in accordance with one or more aspects of the present disclosure. In the example of FIG. 3, a 14 dB up-fade occurring over 33 ms may be measured.

Figure 4:
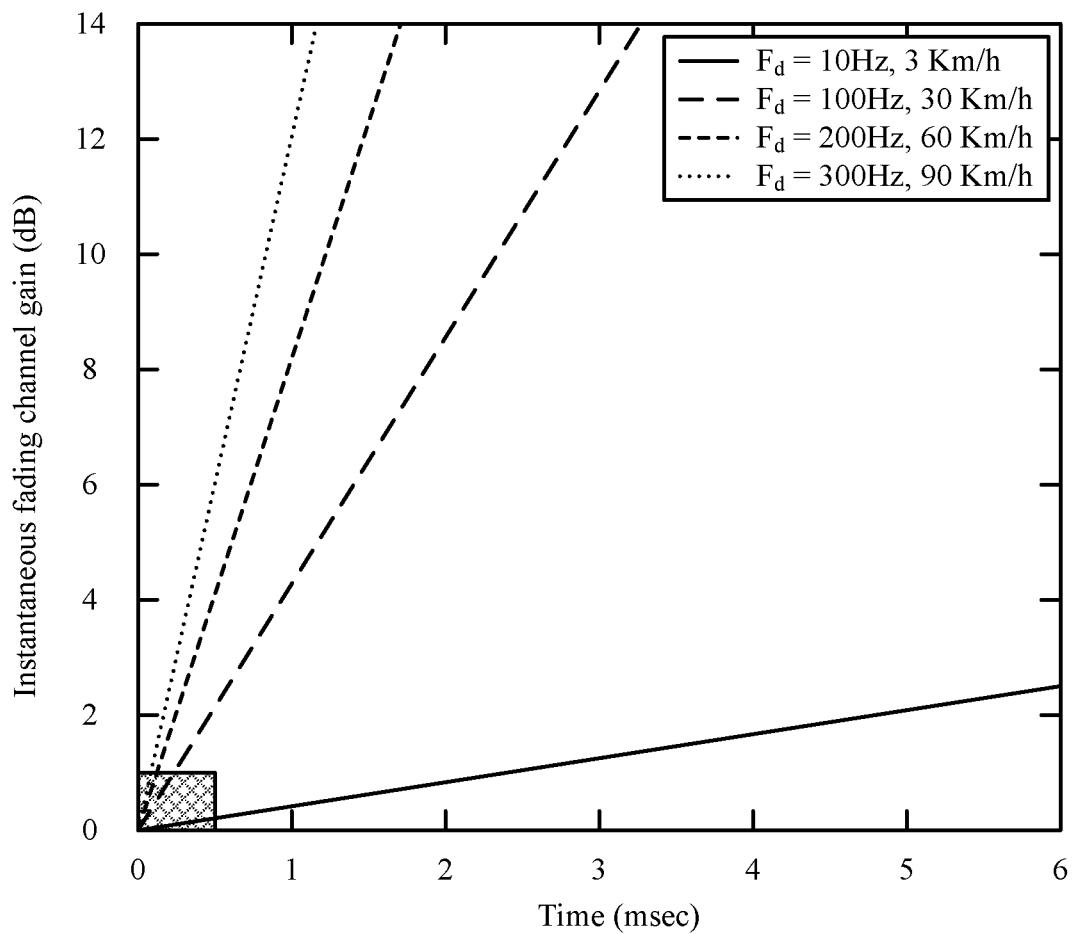
FIG. 4 illustrates an example of linear plots of a channel up-fade for different Doppler spreads in accordance with one or more aspects of the present disclosure.

FIG. 4 illustrates an example of linear plots 400 of a channel up-fade for different Doppler spreads in accordance with one or more aspects of the present disclosure.

Figure 5:
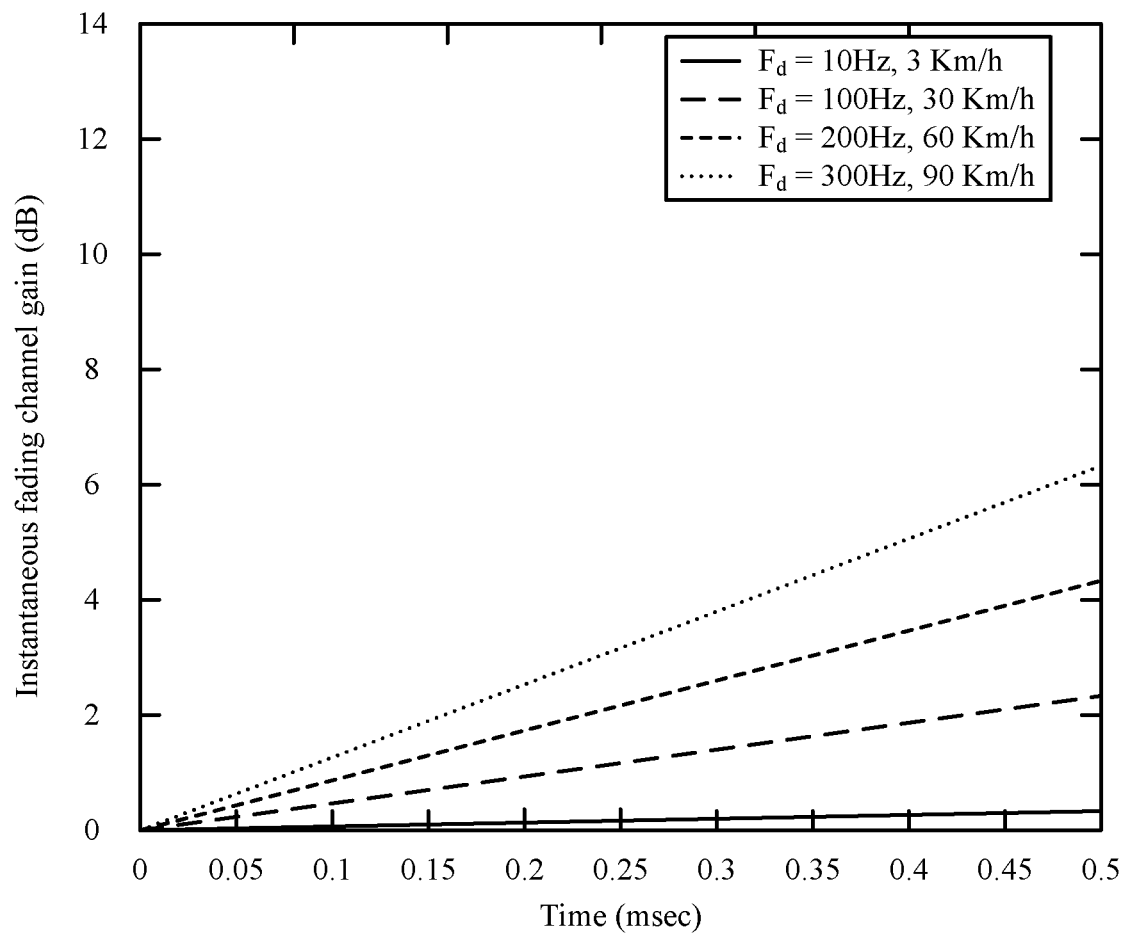
FIG. 5 illustrates an example of linear plots of a channel up-fade for different Doppler spreads in a single slot in accordance with one or more aspects of the present disclosure.

FIG. 5 illustrates an example of linear plots 500 of a channel up-fade for different Doppler spreads in a single slot in accordance with one or more aspects of the present disclosure. In a sub-6 GHz spectrum with a subcarrier spacing of 30 kHz, one slot duration may be calculated as:

$$T_{slot} = \frac{1}{30 \text{ KHz}} 15 = 0.5 \text{ ms.}$$

Table 4 shows a maximum channel up-fade for each of the linear plots 500.

TABLE 4

Channel up-fade over one slot for different Doppler spreads

| Speed [Km/h] | Doppler Spread [Hz] | Up-fade over one slot (dB) |
|---|---|---|
| 3 | 10 | 0.2 |
| 30 | 100 | 2.1 |
| 60 | 200 | 4.2 |
| 90 | 300 | 6.3 |

At a low speed corresponding to a Doppler spread of 10 Hz, a fade margin (e.g., for a full single slot reception) may be 0.2 dB. At a medium speed corresponding to a Doppler spread of 100 Hz, a fade margin may be 2.1 dB. At high speeds corresponding to Doppler spreads of 200 Hz and 300 Hz, fade margins may be 4.2 dB and 6.3 dB, respectively. Thus, for each of the speeds in Table 4, a backoff to a receiver gain accounting for a fade margin of 10 dB may be excessive (e.g., since the fade margins may be less than 10 dB). In particular, for a single slot reception, it may be appropriate to use a tighter budget on a fade margin. Further, in order to lower a fade margin, a UE 115 may request that a network entity transmits data in a shorter or shortened slot (e.g., half of a slot or one-third of a slot). At a medium speed, transmitting in half of a slot may reduce a fade margin to 1 dB, and at higher speeds transmitting in half of a slot or one third of a slot may reduce a fade margin to 2 dB.

Table 5 shows estimates of the required SNRs for super-high order modulations with a relaxed fade margin applied (e.g., for a single slot reception).

TABLE 5

Estimates of the required SNRs for super-high order modulations with a relaxed fade margin

| Modulation | Required SNR in fading channel (dB) | Low speed- Required SNR in fading channel & ADC constraint (dB) | Medium speed- Required SNR in fading channel & ADC constraint (dB) | High speed- Required SNR in fading channel & ADC constraint (dB) | Loss (dB) |
|---|---|---|---|---|---|
| 1K-QAM | 45 | 45.04 | 45.07 | 45.12-45.2 | 0.04-0.2 |
| 2K-QAM | 48 | 48.1 | 48.15 | 48.25-48.41 | 0.1-0.41 |
| 4K-QAM | 51 | 51.2 | 51.31 | 51.51-51.86 | 0.2-0.86 |
| 8K-QAM | 54 | 54.4 | 54.63 | 55.08-55.92 | 0.4-1.92 |
| 16K-QAM | 57 | 57.84 | 58.38 | 58.52-62.44 | 0.84-5.44 |

As shown, the losses may be significantly lower (e.g., the losses due to fade margin and ADC quantization may be much smaller), and 16K-QAM may become operable. At a low speed corresponding to a Doppler spread of 10 Hz, a fade margin may be 0.2 dB, and SQNR=54.76+ (10−0.2)=64.56 dB. At a medium speed corresponding to a Doppler spread of 100 Hz, a fade margin may be 2.1 dB, and SQNR=54.76+(10−2.1)=62.66 dB. Alternatively, at a medium speed corresponding to a Doppler spread of 100 Hz, a fade margin for a shorter slot (e.g., half slot) may be 1 dB, and SQNR=54.76+(10−1)=63.76 dB. At high speeds corresponding to Doppler spreads of 200 Hz and 300 Hz, fade margins may be 4.2 dB and 6.3 dB, respectively, and SQNR=54.76+(10−{4.2,6.3})={60.56, 58.46} dB. In some cases, at high speeds corresponding to Doppler spreads of 200 Hz and 300 Hz, a UE 115 may request that a network entity 105 transmits in a shorter slot (e.g., half or one third of a slot). In such cases, a fade margin for a shorter slot may be 1 dB, and SQNR=54.76+(10−1)=63.76 dB.

Figure 6:
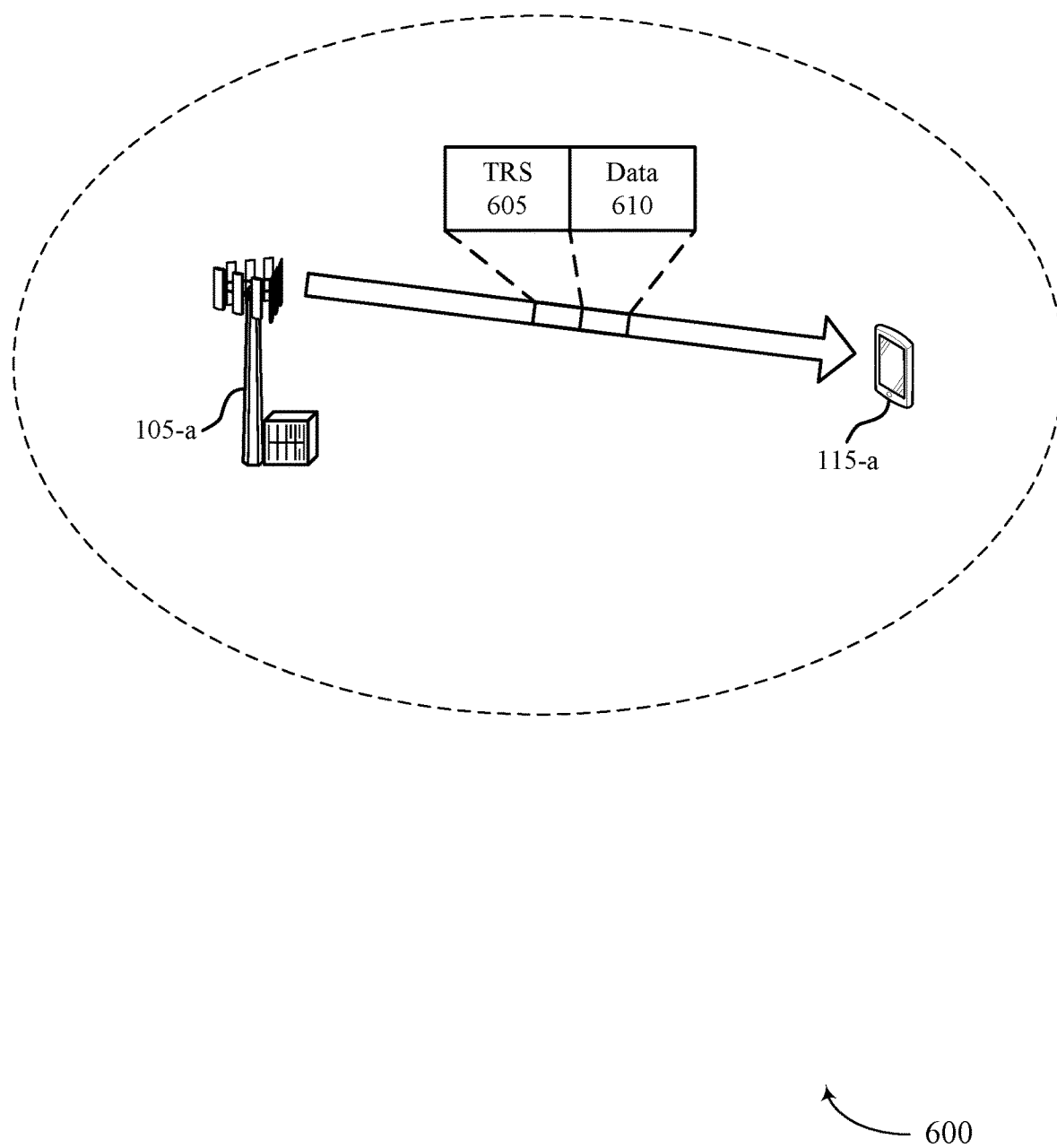
FIG. 6 illustrates an example of a wireless communications system that supports automatic gain control for super-high order modulations in accordance with one or more aspects of the present disclosure.

FIG. 6 illustrates an example of a wireless communications system 600 that supports automatic gain control for super-high order modulations in accordance with one or more aspects of the present disclosure. The wireless communications system 600 includes a UE 115-a, which may be an example of a UE 115 described with reference to FIGS. 1-5. The wireless communications system 600 also includes a network entity 105-b, which may be an example of a network entity 105 described with reference to FIGS. 1-5. The wireless communications system 600 may implement aspects of the wireless communications system 100. For instance, the wireless communications system 600 may support efficient techniques for supporting super-high order modulations given the limitations of an ADC.

In one aspect, the network entity 105-a may transmit a TRS 605 in a first slot adjacent in time to a second slot allocated for transmitting data 610 with a high order modulation. The UE 115-a may receive the TRS 605 and may adjust a receiver gain based on the TRS 605 before receiving the data 610 associated with the super high order modulation. That is, in order to achieve a tight budget for a fade margin, when the network entity 105-a determines to transmit downlink data with a super-high order modulation to the UE 115-a, the network entity 105-a may transmit a TRS (e.g., periodic or synchronized TRS) right before transmitting the data (e.g., the data slot). The network entity 105-a may also avoid transmitting TRS for the data 610 well in advance of the data (e.g., refrain from using an aperiodic or unsynchronized TRS scheme). Thus, when in a super-high order modulation transmission mode, TRSs from the network entity 105-a may be periodic and adjacent to data slots. As a result, the receiver gain at the UE 115-b (e.g., determined based on the TRS 605) may more accurately reflect current channel conditions and may not be overly restricted based on an outdated calibration using an old TRS.

In some examples, the network entity 105-a may transmit the TRS 605 in the first slot adjacent to the second slot based on determining that the data 610 is associated with a super-high order modulation. Similarly, the UE 105-a may monitor the first slot for the TRS 605 based on determining that the data 610 is associated with a super-high order modulation. The network entity 105-a or the UE 105-a may determine that the data 610 is associated with a super-high order modulation by determining that a modulation order of the data 610 satisfies a threshold modulation order. The network entity 105-a may signal the threshold modulation order to the UE 105-a, or the UE 105-a may otherwise be configured with the threshold modulation order.

In some cases, the TRS may be periodic if the network entity 105-a is scheduled to periodically transmit downlink data with a super-high order modulation. That is, the network entity 105-a may transmit TRS in a slot adjacent to each periodic transmission of downlink data associated with a super-high order modulation. In any case, the TRS may be synchronized with a transmission of downlink data associated with a super-high order modulation.

Figure 7:
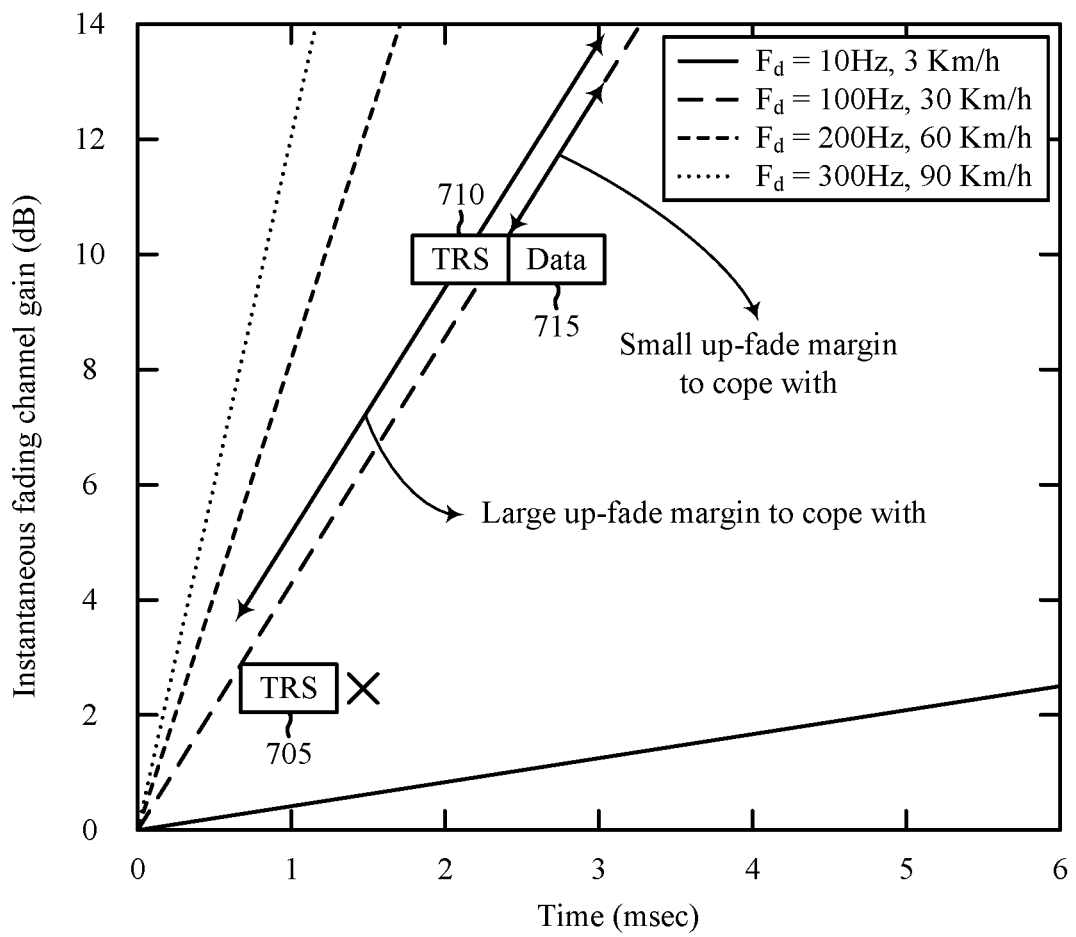
FIG. 7 illustrates an example of an impact of a TRS location on a channel up-fade margin in accordance with one or more aspects of the present disclosure.

FIG. 7 illustrates an example of an impact 700 of a TRS location on a channel up-fade margin in accordance with one or more aspects of the present disclosure. If a network entity transmits the TRS 705 (e.g., aperiodic and non-adjacent TRS) instead of the TRS 710 (e.g., periodic and adjacent TRS), an AGC at a UE may lock on to the TRS 705 (e.g., which is not adjacent to the data 715), and the up-fade range that the UE may cope with may be higher. Instead of transmitting the TRS 705, the network entity 105-*a* may transmit the TRS 710 in a slot adjacent to a slot carrying the data 715. Thus, an AGC at the UE 115-*a* may lock on to the TRS 710 (e.g., which is adjacent to the data 715), and the up-fade range that the UE 115-*a* may cope with may be much smaller. That is, an AGC at the UE 115-*a* may lock on to a most updated fading channel gain, and the UE 115-*a* may account for a much smaller residual up-fade margin. As such, a power of an input signal to the AGC may not increase as significantly after receiving the TRS 710 (e.g., compared to the potential power increase after receiving the TRS 705), and the AGC may use a smaller backoff for a receiver gain applied to the input signal. Thus, the SNR of the input signal may increase, which, in turn, enables the operation of super-high order modulations.

In another aspect, the UE 115-*a* may indicate (e.g., based on a receiver gain at the UE 115-*a*) a type of slot (e.g., shortened slot) or length of a slot (e.g., half or one third of a standard slot) in which the network entity 105-*a* may transmit data transmissions with a high order modulation. Regardless of support for using periodic and adjacent TRSs for data transmissions associated with super-high order modulations, the UE 115-*a* may estimate a Doppler spread at the UE 115-*a* based on a speed of the UE 115-*a* (e.g., based on determining that the UE 115-*a* is moving at a high speed). The UE 115-*a* may then transmit a message to the network entity 105-*a* (e.g., when the UE 115-*a* is moving at a high speed) indicating that the network entity 105-*a* is to transmit data associated with super-high order modulations in shortened slots (e.g., having less than 14 symbols) to the UE 115-*a* and not in full slots (e.g., such that an experienced up-fade margin may be smaller).

In an example, at high speeds corresponding to Doppler spreads of 200 Hz and 300 Hz, fade margins may be 4.2 dB and 6.3 dB, respectively, and $SQNR=54.76+(10-\{4.2,6.3\})=\{60.56, 58.46\}$ dB. In this example, to increase SQNR at high speeds corresponding to Doppler spreads of 200 Hz and 300 Hz, a UE 115 may request that a network entity 105 transmits in a shorter slot (e.g., half or one third of a slot). In such cases, a fade margin for a shorter slot may be 1 dB, and $SQNR=54.76+(10-1)=63.76$ dB. Thus, the UE 115-*a* may experience a smaller loss in required SNR.

In yet another aspect, the UE 115-*a* may indicate (e.g., based on a receiver gain at the UE 115-*a*) a maximum number of slots in which the network entity 105-*a* may transmit data transmissions with a high modulation order. For instance, for the UE 115-*a* to be able to receive multiple continuous slots of data associated with super-high order modulations, the UE 115-*a* may signal, to the network entity 105-*a*, a maximum number of continuous super-high order modulation downlink slots that the UE 115-*a* may receive such that an incurred fade margin may introduce a small SNR loss. The UE 115-*a* may determine an achievable SQNR of an ADC at the UE 115-*a* (e.g., ADC_SQNR), and the UE 115-*a* may determine a required SNR for a super-high order modulation (e.g., per super-high order modulation or MCS). The UE 115-*a* may then use the determined achievable SQNR and the required SNR for a super-high order modulation to identify a maximum number of continuous slots in which the UE 115-*a* may receive data associated with the super-high order modulation. For instance, the maximum number of continuous slots may be based on an estimated, maximum channel up-fade that the UE 115-*a* may tolerate in the slots while achieving the required SNR for the super-high order modulation.

Figure 8:
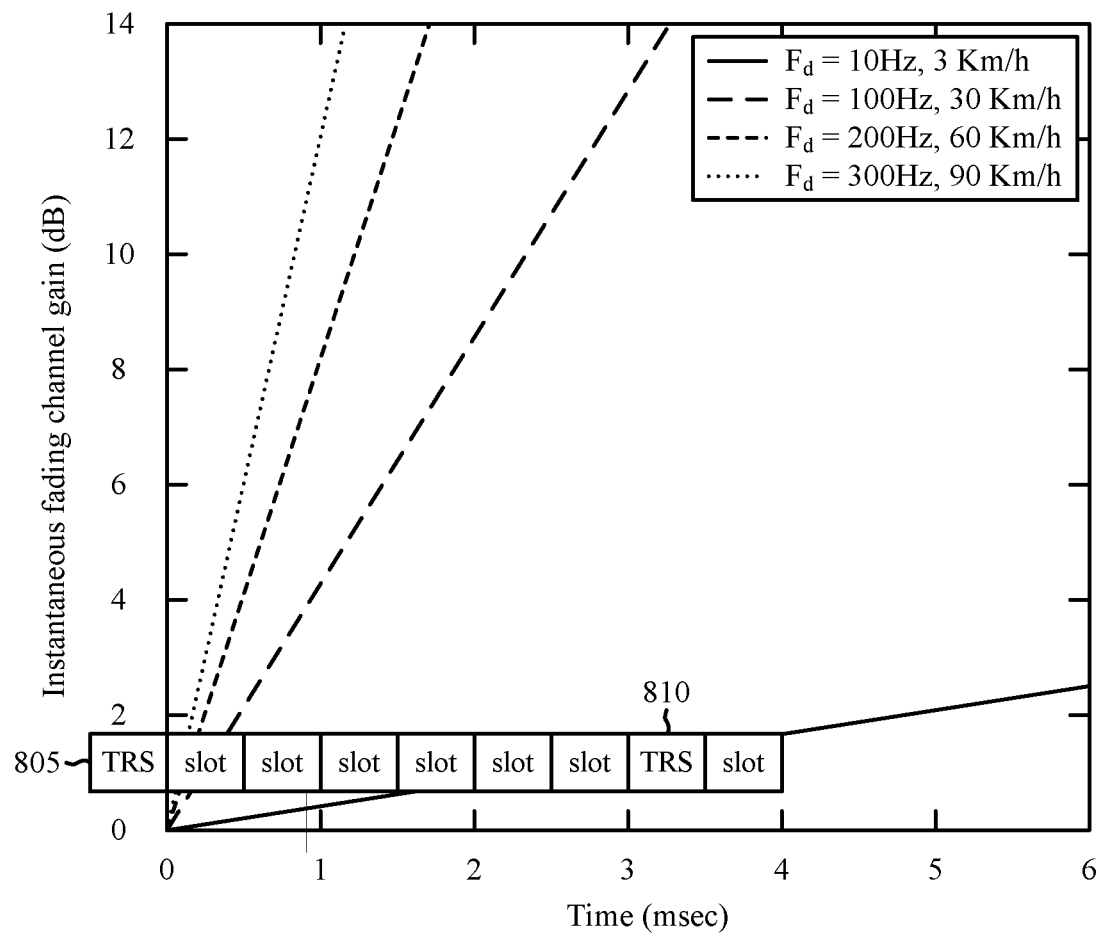
FIG. 8 illustrates an example of a maximum number of continuous slots in which a user equipment (UE) may receive data associated with a super-high order modulation in accordance with one or more aspects of the present disclosure.

FIG. 8 illustrates an example of a maximum number of continuous slots 800 in which the UE 115-*a* may receive data associated with a super-high order modulation in accordance with one or more aspects of the present disclosure. The network entity 105-*a* may transmit, and the UE 115-*a* may receive, a first TRS 805 adjacent to slots including data associated with the super-high order modulation. The number of slots including data may be equal to or less than a maximum number of continuous slots in which the UE 115-*a* may receive data associated with the super-high order modulation. The network entity 105-*a* may then transmit, and the UE 115-*a* may receive, a second TRS 810 adjacent to another slot including data associated with the super-high order modulation.

The message from the UE 115-*a* including the maximum number of slots (e.g., 6 slots) may depend on an internal Doppler estimation at the UE 115-*a*. The lower the Doppler, the higher the number of continuous super-high order modulation downlink slots the UE 115-*a* may report as the maximum number of slots. The report of the maximum number of slots may also depend on an actual order of a super-high order modulation (e.g., not only on a Doppler spread estimation). For example, the UE 115-*a* may cope with a higher fade margin for 1K-QAM than for 16K-QAM. Thus, the lower the modulation order, the higher the number of continuous super-high order modulation downlink slots the UE 115-*a* may report as the maximum number of slots. As described, following a group of continuous downlink slots (e.g., the maximum number of slots) including data associated with a super-high order modulation, the network entity 105-*a* may transmit another TRS (e.g., another TRS slot) if the network entity 105-*a* is to transmit further data associated with the super-high order modulation. As such, the UE 115-*a* may update its AGC level and cope again with a small residual fade margin for the further data associated with the super-high order modulation.

Figure 9:
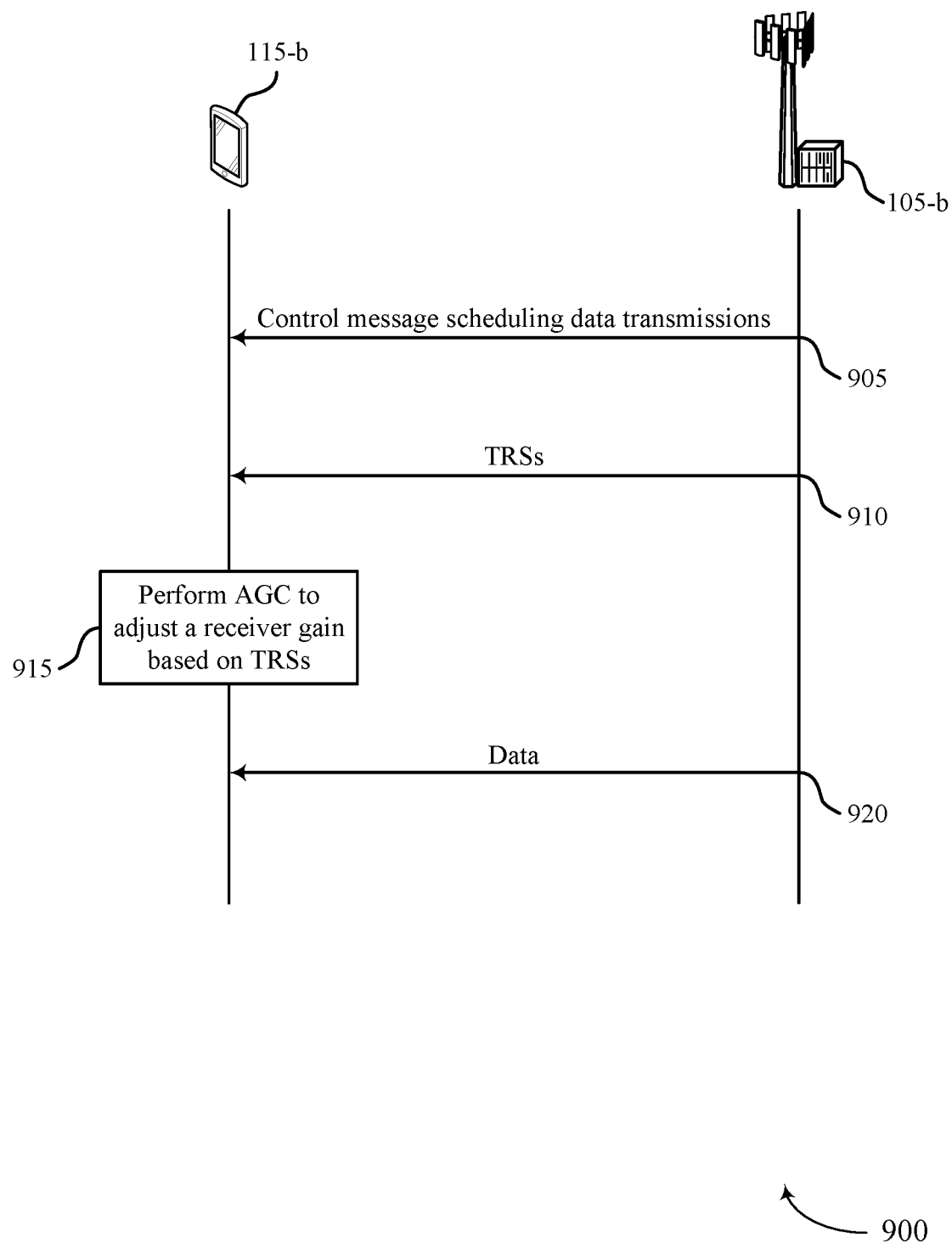
FIG. 9 illustrates an example of a process flow that supports automatic gain control for super-high order modulations in accordance with one or more aspects of the present disclosure.

FIG. 9 illustrates an example of a process flow 900 that supports automatic gain control for super-high order modulations in accordance with one or more aspects of the present disclosure. The process flow 900 includes a UE 115-*b*, which may be an example of a UE 115 described with reference to FIGS. 1-8. The process flow 900 also includes a network entity 105-*b*, which may be an example of a network entity 105 described with reference to FIGS. 1-8. The process flow 900 may implement aspects of the wireless communications system 100 or the wireless communications system 600. For instance, the process flow 900 may support efficient techniques for supporting super-high order modulations given the limitations of an ADC.

In the following description of the process flow 900, the signaling exchanged between the UE 115-*b* and the network entity 105-*b* may be exchanged in a different order than the example order shown, or the operations performed by the UE 115-*b* and the network entity 105-*b* may be performed in different orders or at different times. Some operations may also be omitted from the process flow 900, and other operations may be added to the process flow 900.

At 905, the network entity 105-*b* may transmit, and the UE 115-*b* may receive a control message scheduling one or more data transmissions associated with a modulation order that satisfies a threshold modulation order (e.g., a super-high modulation order). The UE 115-*b* may then monitor a set of resources in a first slot for a TRS (e.g., a periodic TRS). In some cases, the first slot may be adjacent in time to a second slot associated with one or more data transmissions, and the set of resources may be based on the modulation order. In some cases, a number of slots or a time between the first slot and the second slot may be below a threshold. At 910, the network entity 105-*b* may transmit, and the UE 115-*b* may receive, a TRS on the set of resources in the first slot. At 915, the UE 115-*b* may perform AGC to adjust a receiver gain of the UE 115-*b* based on the monitoring (e.g., based on the TRS). At 920, the network entity 105-*b* may transmit, and the UE 115-*b* may receive, the one or more data transmissions in the second slot in accordance with the control message and based on the monitoring.

In some cases, the UE 115-*b* may transmit, and the network entity 105-*b* may receive, a request for the network entity to transmit the one or more data transmissions in one or more shortened slots (e.g., where the second slot is a shortened slot). The request for the network entity to transmit the one or more data transmissions in one or more shortened slots may be based on a Doppler spread estimation at the UE 115-*b* or a speed of the UE 115-*b* satisfying a threshold. In some cases, the UE 115-*b* may transmit, and the network entity 105-*b* may receive, an indication of a maximum quantity of continuous slots in which the network entity may transmit one or more data transmissions associated with the modulation order that satisfies the threshold modulation order.

The UE 115-*b* may identify the maximum quantity of continuous slots based on a Doppler spread estimation at the UE, a speed of the UE, or the modulation order associated with the one or more data transmissions. The maximum quantity of continuous slots may be inversely proportional to the Doppler spread estimation at the UE, the speed of the UE, and the modulation order associated with the one or more data transmissions. In some cases, the UE 115-*b* may also monitor a second set of resources in a third slot for another TRS. A quantity of continuous slots between the second slot and the third slot may be less than or equal to the maximum quantity of slots. In some cases, an SNR of the one or more data transmissions may satisfy an SNR requirement. The SNR requirement may be based on channel fading losses and ADC losses.

Figure 10:
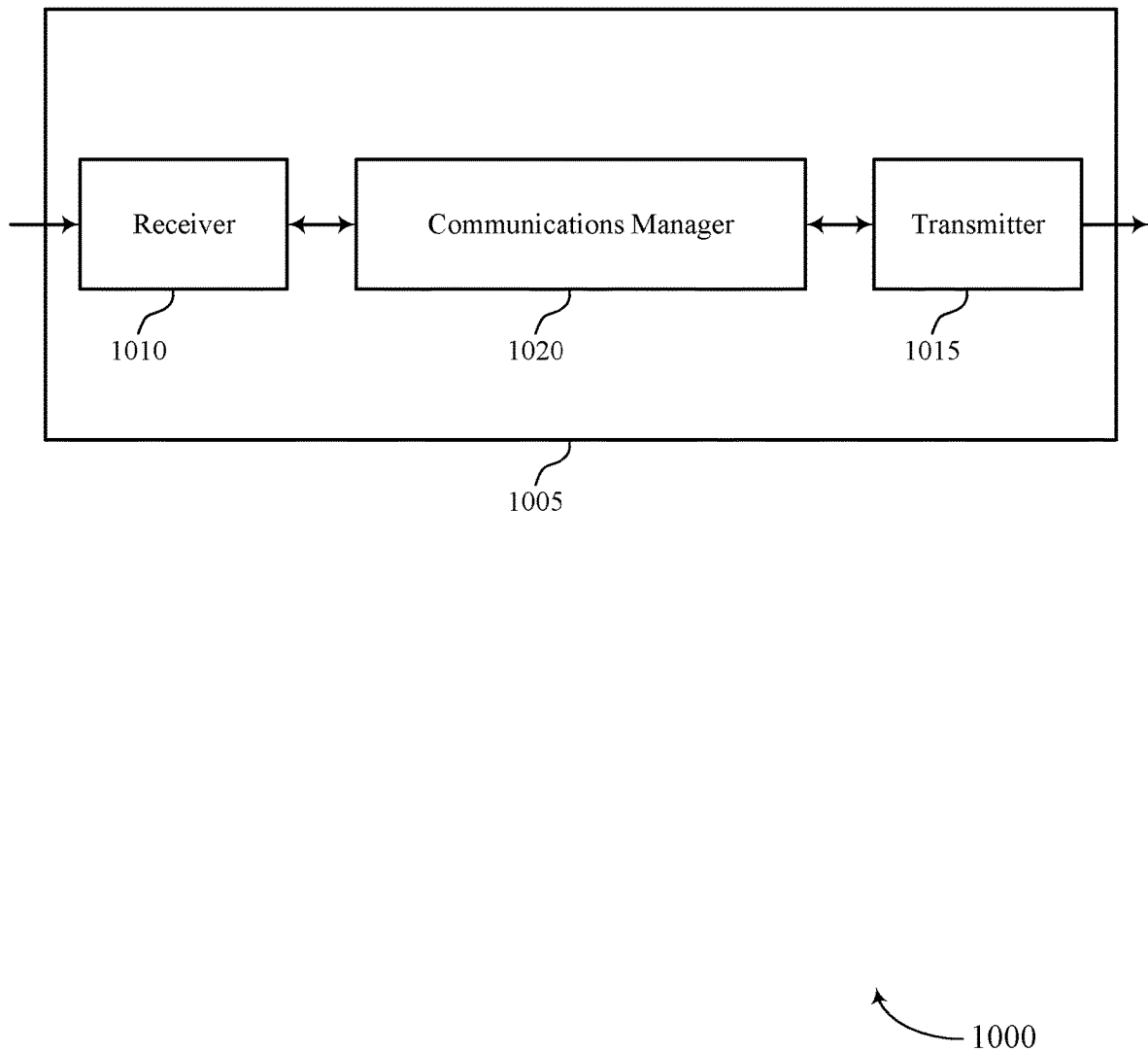
FIGS. 10 and 11 show block diagrams of devices that support automatic gain control for super-high order modulations in accordance with one or more aspects of the present disclosure.

FIG. 10 shows a block diagram 1000 of a device 1005 that supports automatic gain control for super-high order modulations in accordance with one or more aspects of the present disclosure. The device 1005 may be an example of aspects of a UE 115 as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for receiving information such as packets, user data, control information, or any combination thereof associated with various information channels (e.g., control channels, data channels, information channels related to automatic gain control for super-high order modulations). Information may be passed on to other components of the device 1005. The receiver 1010 may utilize a single antenna or a set of multiple antennas.

The transmitter 1015 may provide a means for transmitting signals generated by other components of the device 1005. For example, the transmitter 1015 may transmit information such as packets, user data, control information, or any combination thereof associated with various information channels (e.g., control channels, data channels, information channels related to automatic gain control for super-high order modulations). In some examples, the transmitter 1015 may be co-located with a receiver 1010 in a transceiver module. The transmitter 1015 may utilize a single antenna or a set of multiple antennas.

The communications manager 1020, the receiver 1010, the transmitter 1015, or various combinations thereof or various components thereof may be examples of means for performing various aspects of automatic gain control for super-high order modulations as described herein. For example, the communications manager 1020, the receiver 1010, the transmitter 1015, or various combinations or components thereof may support a method for performing one or more of the functions described herein.

In some examples, the communications manager 1020, the receiver 1010, the transmitter 1015, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 1020, the receiver 1010, the transmitter 1015, or various combinations or components thereof may be implemented in code (e.g., as communications management software or firmware) executed by a processor. If implemented in code executed by a processor, the functions of the communications manager 1020, the receiver 1010, the transmitter 1015, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 1020 may be configured to perform various operations (e.g., receiving, obtaining, monitoring, outputting, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to obtain information, output information, or perform various other operations as described herein.

The communications manager 1020 may support wireless communication at a UE in accordance with examples as disclosed herein. For example, the communications manager 1020 may be configured as or otherwise support a means for receiving a control message scheduling one or more data transmissions associated with a modulation order that satisfies a threshold modulation order. The communications manager 1020 may be configured as or otherwise support a means for monitoring a set of resources in a first slot for a tracking reference signal, where the first slot is adjacent in time to a second slot associated with the one or more data transmissions, and the set of resources is based on the modulation order. The communications manager 1020 may be configured as or otherwise support a means for receiving the one or more data transmissions in the second slot in accordance with the control message and based on the monitoring.

By including or configuring the communications manager 1020 in accordance with examples as described herein, the device 1005 (e.g., a processor controlling or otherwise coupled with the receiver 1010, the transmitter 1015, the communications manager 1020, or a combination thereof) may support techniques for more efficient utilization of communication resources. Because the device 1005 may adapt or consider a receiver gain when communicating with a network entity, the device 1005 may be able to receive data associated with super-high order modulations. As such, the device 1005 may receive more data in a time resource (e.g., a slot), resulting in the more efficient utilization of communication resources.

Figure 11:
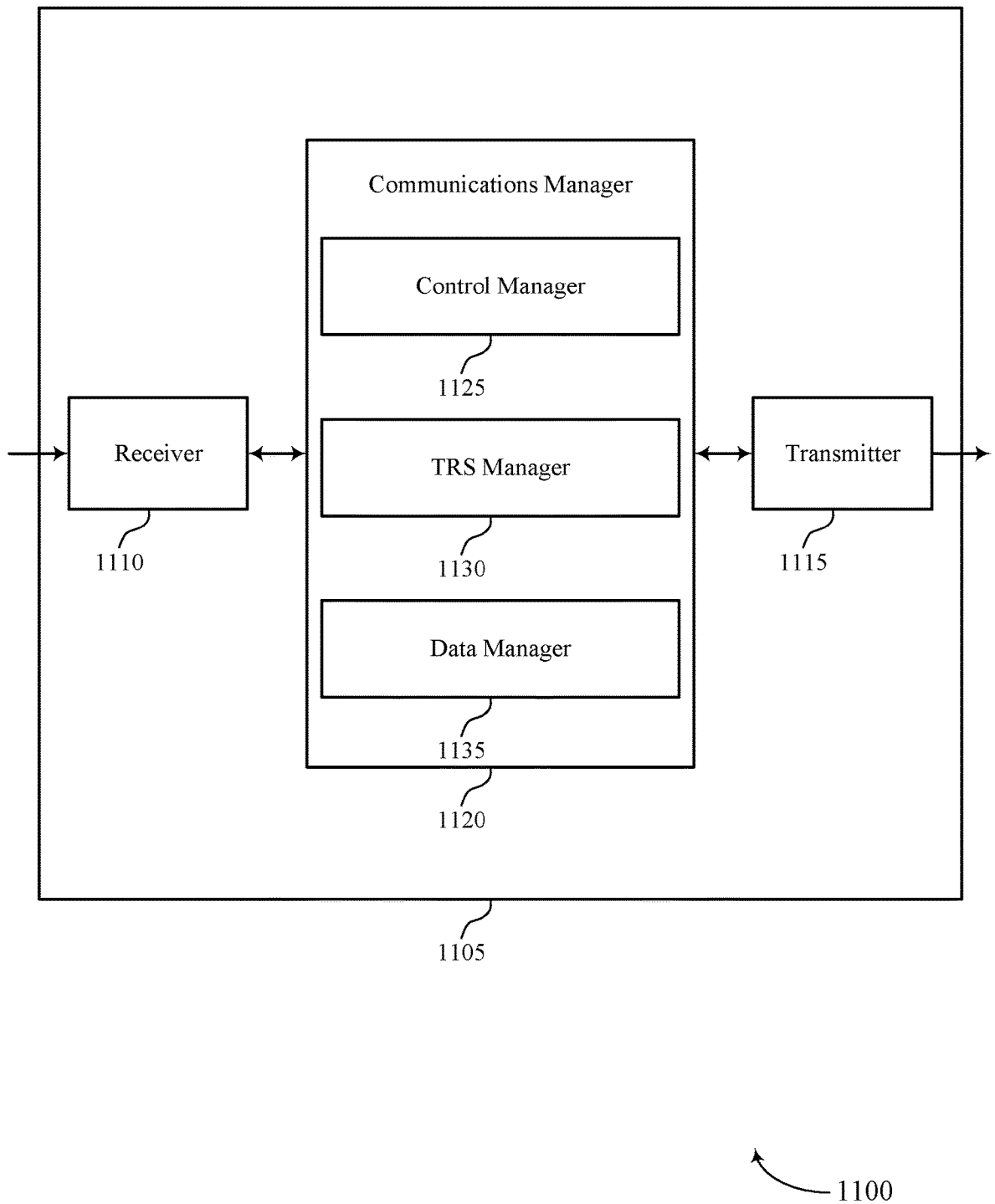

FIG. 11 shows a block diagram 1100 of a device 1105 that supports automatic gain control for super-high order modulations in accordance with one or more aspects of the present disclosure. The device 1105 may be an example of aspects of a device 1005 or a UE 115 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for receiving information such as packets, user data, control information, or any combination thereof associated with various information channels (e.g., control channels, data channels, information channels related to automatic gain control for super-high order modulations). Information may be passed on to other components of the device 1105. The receiver 1110 may utilize a single antenna or a set of multiple antennas.

The transmitter 1115 may provide a means for transmitting signals generated by other components of the device 1105. For example, the transmitter 1115 may transmit information such as packets, user data, control information, or any combination thereof associated with various information channels (e.g., control channels, data channels, information channels related to automatic gain control for super-high order modulations). In some examples, the transmitter 1115 may be co-located with a receiver 1110 in a transceiver module. The transmitter 1115 may utilize a single antenna or a set of multiple antennas.

The device 1105, or various components thereof, may be an example of means for performing various aspects of automatic gain control for super-high order modulations as described herein. For example, the communications manager 1120 may include a control manager 1125, an TRS manager 1130, a data manager 1135, or any combination thereof. The communications manager 1120 may be an example of aspects of a communications manager 1020 as described herein. In some examples, the communications manager 1120, or various components thereof, may be configured to perform various operations (e.g., receiving, obtaining, monitoring, outputting, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to obtain information, output information, or perform various other operations as described herein.

The communications manager 1120 may support wireless communication at a UE in accordance with examples as disclosed herein. The control manager 1125 may be configured as or otherwise support a means for receiving a control message scheduling one or more data transmissions associated with a modulation order that satisfies a threshold modulation order. The TRS manager 1130 may be configured as or otherwise support a means for monitoring a set of resources in a first slot for a tracking reference signal, where the first slot is adjacent in time to a second slot associated with the one or more data transmissions, and the set of resources is based on the modulation order. The data manager 1135 may be configured as or otherwise support a means for receiving the one or more data transmissions in the second slot in accordance with the control message and based on the monitoring.

Figure 12:
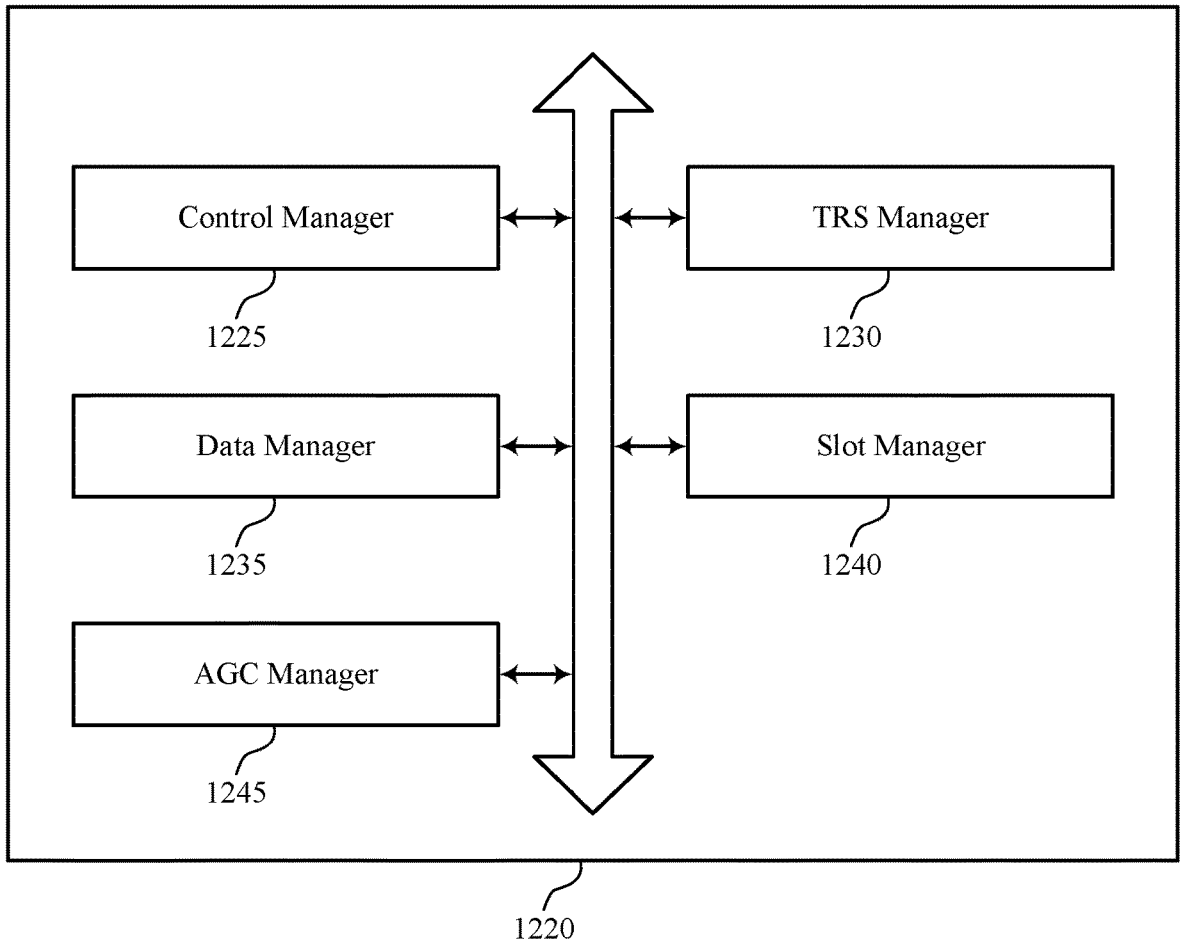
FIG. 12 shows a block diagram of a communications manager that supports automatic gain control for super-high order modulations in accordance with one or more aspects of the present disclosure.

FIG. 12 shows a block diagram 1200 of a communications manager 1220 that supports automatic gain control for super-high order modulations in accordance with one or more aspects of the present disclosure. The communications manager 1220 may be an example of aspects of a communications manager 1020, a communications manager 1120, or both, as described herein. The communications manager 1220, or various components thereof, may be an example of means for performing various aspects of automatic gain control for super-high order modulations as described herein. For example, the communications manager 1220 may include a control manager 1225, an TRS manager 1230, a data manager 1235, a slot manager 1240, an AGC manager 1245, or any combination thereof. Each of these components may communicate, directly or indirectly, with one another (e.g., via one or more buses).

The communications manager 1220 may support wireless communication at a UE in accordance with examples as disclosed herein. The control manager 1225 may be configured as or otherwise support a means for receiving a control message scheduling one or more data transmissions associated with a modulation order that satisfies a threshold modulation order. The TRS manager 1230 may be configured as or otherwise support a means for monitoring a set of resources in a first slot for a tracking reference signal, where the first slot is adjacent in time to a second slot associated with the one or more data transmissions, and the set of resources is based on the modulation order. The data manager 1235 may be configured as or otherwise support a means for receiving the one or more data transmissions in the second slot in accordance with the control message and based on the monitoring.

In some examples, the slot manager 1240 may be configured as or otherwise support a means for transmitting, based on a Doppler spread estimation at the UE or a speed of the UE satisfying a threshold, a request for a network entity to transmit the one or more data transmissions in one or more shortened slots, where the second slot includes a shortened slot.

In some examples, the slot manager 1240 may be configured as or otherwise support a means for transmitting an indication of a maximum quantity of continuous slots in which a network entity is to transmit the one or more data transmissions associated with the modulation order that satisfies the threshold modulation order.

In some examples, the slot manager 1240 may be configured as or otherwise support a means for identifying the maximum quantity of continuous slots based on a Doppler spread estimation at the UE, a speed of the UE, the modulation order associated with the one or more data transmissions, or a combination thereof.

In some examples, the maximum quantity of continuous slots is inversely proportional to the Doppler spread estimation at the UE, the speed of the UE, and the modulation order associated with the one or more data transmissions.

In some examples, the TRS manager 1230 may be configured as or otherwise support a means for monitoring a second set of resources in a third slot for the tracking reference signal, where a quantity of continuous slots between the second slot and the third slot is less than or equal to the maximum quantity of continuous slots.

In some examples, a signal-to-noise ratio of the one or more data transmissions satisfies a signal-to-noise ratio requirement, the signal-to-noise ratio requirement being based on channel fading losses and analog-to-digital conversion losses.

In some examples, the tracking reference signal includes a periodic tracking reference signal.

In some examples, the AGC manager 1245 may be configured as or otherwise support a means for performing automatic gain control to adjust a receiver gain of the UE based on the monitoring, where the one or more data transmissions are received in the second slot using the adjusted receiver gain.

Figure 13:
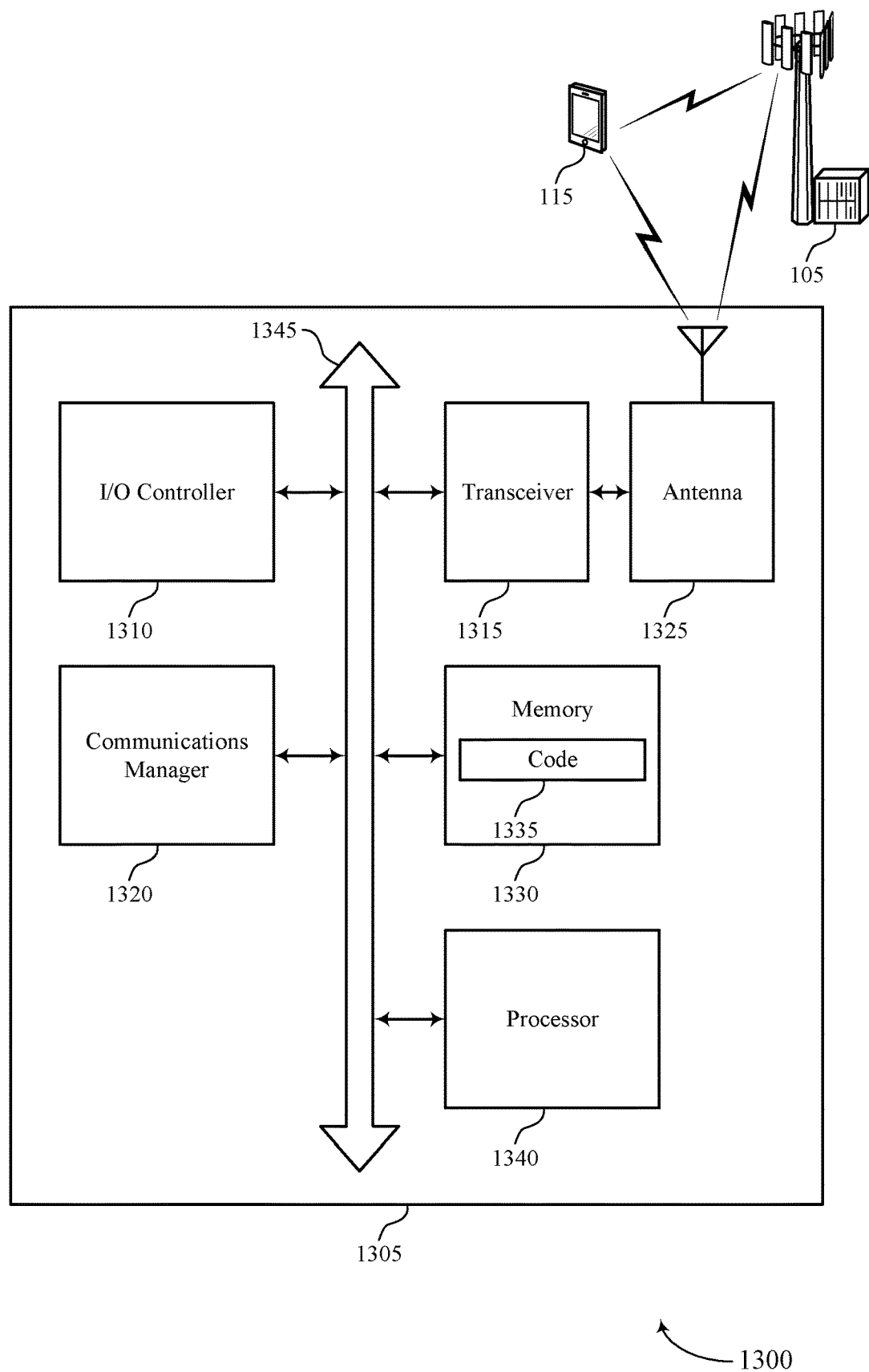
FIG. 13 shows a diagram of a system including a device that supports automatic gain control for super-high order modulations in accordance with one or more aspects of the present disclosure.

FIG. 13 shows a diagram of a system 1300 including a device 1305 that supports automatic gain control for super-high order modulations in accordance with one or more aspects of the present disclosure. The device 1305 may be an example of or include the components of a device 1005, a device 1105, or a UE 115 as described herein. The device 1305 may communicate (e.g., wirelessly) with one or more network entities 105, one or more UEs 115, or any combination thereof. The device 1305 may include components for bi-directional voice and data communications including components for transmitting and receiving communications, such as a communications manager 1320, an input/output (I/O) controller 1310, a transceiver 1315, an antenna 1325, a memory 1330, code 1335, and a processor 1340. These components may be in electronic communication or otherwise coupled (e.g., operatively, communicatively, functionally, electronically, electrically) via one or more buses (e.g., a bus 1345).

The I/O controller 1310 may manage input and output signals for the device 1305. The I/O controller 1310 may also manage peripherals not integrated into the device 1305. In some cases, the I/O controller 1310 may represent a physical connection or port to an external peripheral. In some cases, the I/O controller 1310 may utilize an operating system such as iOS®, ANDROID®, MS-DOS®, MS-WINDOWS®, OS/2®, UNIX®, LINUX®, or another known operating system. Additionally, or alternatively, the I/O controller 1310 may represent or interact with a modem, a keyboard, a mouse, a touchscreen, or a similar device. In some cases, the I/O controller 1310 may be implemented as part of a processor, such as the processor 1340. In some cases, a user may interact with the device 1305 via the I/O controller 1310 or via hardware components controlled by the I/O controller 1310.

In some cases, the device 1305 may include a single antenna 1325. However, in some other cases, the device 1305 may have more than one antenna 1325, which may be capable of concurrently transmitting or receiving multiple wireless transmissions. The transceiver 1315 may communicate bi-directionally, via the one or more antennas 1325, wired, or wireless links as described herein. For example, the transceiver 1315 may represent a wireless transceiver and may communicate bi-directionally with another wireless transceiver. The transceiver 1315 may also include a modem to modulate the packets, to provide the modulated packets to one or more antennas 1325 for transmission, and to demodulate packets received from the one or more antennas 1325. The transceiver 1315, or the transceiver 1315 and one or more antennas 1325, may be an example of a transmitter 1015, a transmitter 1115, a receiver 1010, a receiver 1110, or any combination thereof or component thereof, as described herein.

The memory 1330 may include random access memory (RAM) and read-only memory (ROM). The memory 1330 may store computer-readable, computer-executable code 1335 including instructions that, when executed by the processor 1340, cause the device 1305 to perform various functions described herein. The code 1335 may be stored in a non-transitory computer-readable medium such as system memory or another type of memory. In some cases, the code 1335 may not be directly executable by the processor 1340 but may cause a computer (e.g., when compiled and executed) to perform functions described herein. In some cases, the memory 1330 may contain, among other things, a basic I/O system (BIOS) which may control basic hardware or software operation such as the interaction with peripheral components or devices.

The processor 1340 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In some other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting automatic gain control for super-high order modulations). For example, the device 1305 or a component of the device 1305 may include a processor 1340 and memory 1330 coupled with or to the processor 1340, the processor 1340 and memory 1330 configured to perform various functions described herein.

The communications manager 1320 may support wireless communication at a UE in accordance with examples as disclosed herein. For example, the communications manager 1320 may be configured as or otherwise support a means for receiving a control message scheduling one or more data transmissions associated with a modulation order that satisfies a threshold modulation order. The communications manager 1320 may be configured as or otherwise support a means for monitoring a set of resources in a first slot for a tracking reference signal, where the first slot is adjacent in time to a second slot associated with the one or more data transmissions, and the set of resources is based on the modulation order. The communications manager 1320 may be configured as or otherwise support a means for receiving the one or more data transmissions in the second slot in accordance with the control message and based on the monitoring.

By including or configuring the communications manager 1320 in accordance with examples as described herein, the device 1305 may support techniques for more efficient utilization of communication resources. Because the device 1305 may adapt or consider a receiver gain when communicating with a network entity, the device 1305 may be able to receive data associated with super-high order modulations. As such, the device 1305 may receive more data in a time resource (e.g., a slot), resulting in the more efficient utilization of communication resources.

In some examples, the communications manager 1320 may be configured to perform various operations (e.g., receiving, monitoring, transmitting) using or otherwise in cooperation with the transceiver 1315, the one or more antennas 1325, or any combination thereof. Although the communications manager 1320 is illustrated as a separate component, in some examples, one or more functions described with reference to the communications manager 1320 may be supported by or performed by the processor 1340, the memory 1330, the code 1335, or any combination thereof. For example, the code 1335 may include instructions executable by the processor 1340 to cause the device 1305 to perform various aspects of automatic gain control for super-high order modulations as described herein, or the processor 1340 and the memory 1330 may be otherwise configured to perform or support such operations.

Figure 14:
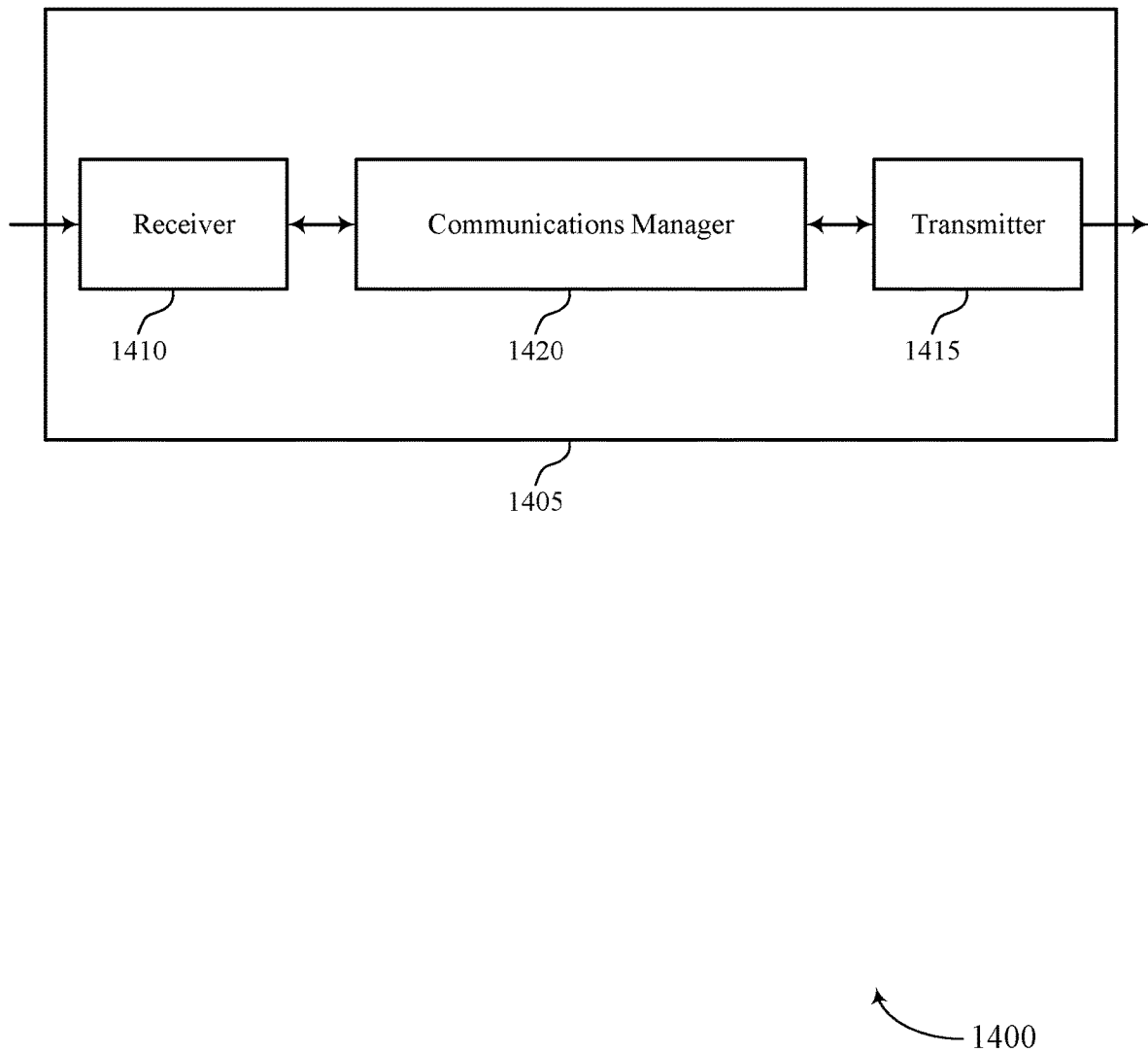
FIGS. 14 and 15 show block diagrams of devices that support automatic gain control for super-high order modulations in accordance with one or more aspects of the present disclosure.

FIG. 14 shows a block diagram 1400 of a device 1405 that supports automatic gain control for super-high order modulations in accordance with one or more aspects of the present disclosure. The device 1405 may be an example of aspects of a network entity 105 as described herein. The device 1405 may include a receiver 1410, a transmitter 1415, and a communications manager 1420. The device 1405 may also include a processor. Each of these components may be in communication with one another (e.g., via one or more buses).

The receiver 1410 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1405. In some examples, the receiver 1410 may support obtaining information by receiving signals via one or more antennas. Additionally, or alternatively, the receiver 1410 may support obtaining information by receiving signals via one or more wired (e.g., electrical, fiber optic) interfaces, wireless interfaces, or any combination thereof.

The transmitter 1415 may provide a means for outputting (e.g., transmitting, providing, conveying, sending) information generated by other components of the device 1405. For example, the transmitter 1415 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1415 may support outputting information by transmitting signals via one or more antennas. Additionally, or alternatively, the transmitter 1415 may support outputting information by transmitting signals via one or more wired (e.g., electrical, fiber optic) interfaces, wireless interfaces, or any combination thereof. In some examples, the transmitter 1415 and the receiver 1410 may be co-located in a transceiver, which may include or be coupled with a modem.

The communications manager 1420, the receiver 1410, the transmitter 1415, or various combinations thereof or various components thereof may be examples of means for performing various aspects of automatic gain control for super-high order modulations as described herein. For example, the communications manager 1420, the receiver 1410, the transmitter 1415, or various combinations or components thereof may support a method for performing one or more of the functions described herein.

In some examples, the communications manager 1420, the receiver 1410, the transmitter 1415, or various combinations or components thereof may be implemented in hardware (e.g., in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 1420, the receiver 1410, the transmitter 1415, or various combinations or components thereof may be implemented in code (e.g., as communications management software or firmware) executed by a processor. If implemented in code executed by a processor, the functions of the communications manager 1420, the receiver 1410, the transmitter 1415, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 1420 may be configured to perform various operations (e.g., receiving, obtaining, monitoring, outputting, transmitting) using or otherwise in cooperation with the receiver 1410, the transmitter 1415, or both. For example, the communications manager 1420 may receive information from the receiver 1410, send information to the transmitter 1415, or be integrated in combination with the receiver 1410, the transmitter 1415, or both to obtain information, output information, or perform various other operations as described herein.

The communications manager 1420 may support wireless communication at a network entity in accordance with examples as disclosed herein. For example, the communications manager 1420 may be configured as or otherwise support a means for transmitting a control message scheduling one or more data transmissions to a UE, the one or more data transmissions associated with a modulation order that satisfies a threshold modulation order. The communications manager 1420 may be configured as or otherwise support a means for transmitting a tracking reference signal on a set of resources in a first slot, where the first slot is adjacent in time to a second slot associated with the one or more data transmissions, and the set of resources is based on the modulation order. The communications manager 1420 may be configured as or otherwise support a means for transmitting the one or more data transmissions in the second slot in accordance with the control message and based on transmitting the tracking reference signal in the first slot.

By including or configuring the communications manager 1420 in accordance with examples as described herein, the device 1405 (e.g., a processor controlling or otherwise coupled with the receiver 1410, the transmitter 1415, the communications manager 1420, or a combination thereof) may support techniques for more efficient utilization of communication resources. Because the device 1405 may allow a UE to adapt or consider a receiver gain when communicating with the device 1405, the device 1405 may be able to transmit data associated with super-high order modulations to the UE. As such, the device 1405 may transmit more data in a time resource (e.g., a slot), resulting in the more efficient utilization of communication resources.

Figure 15:
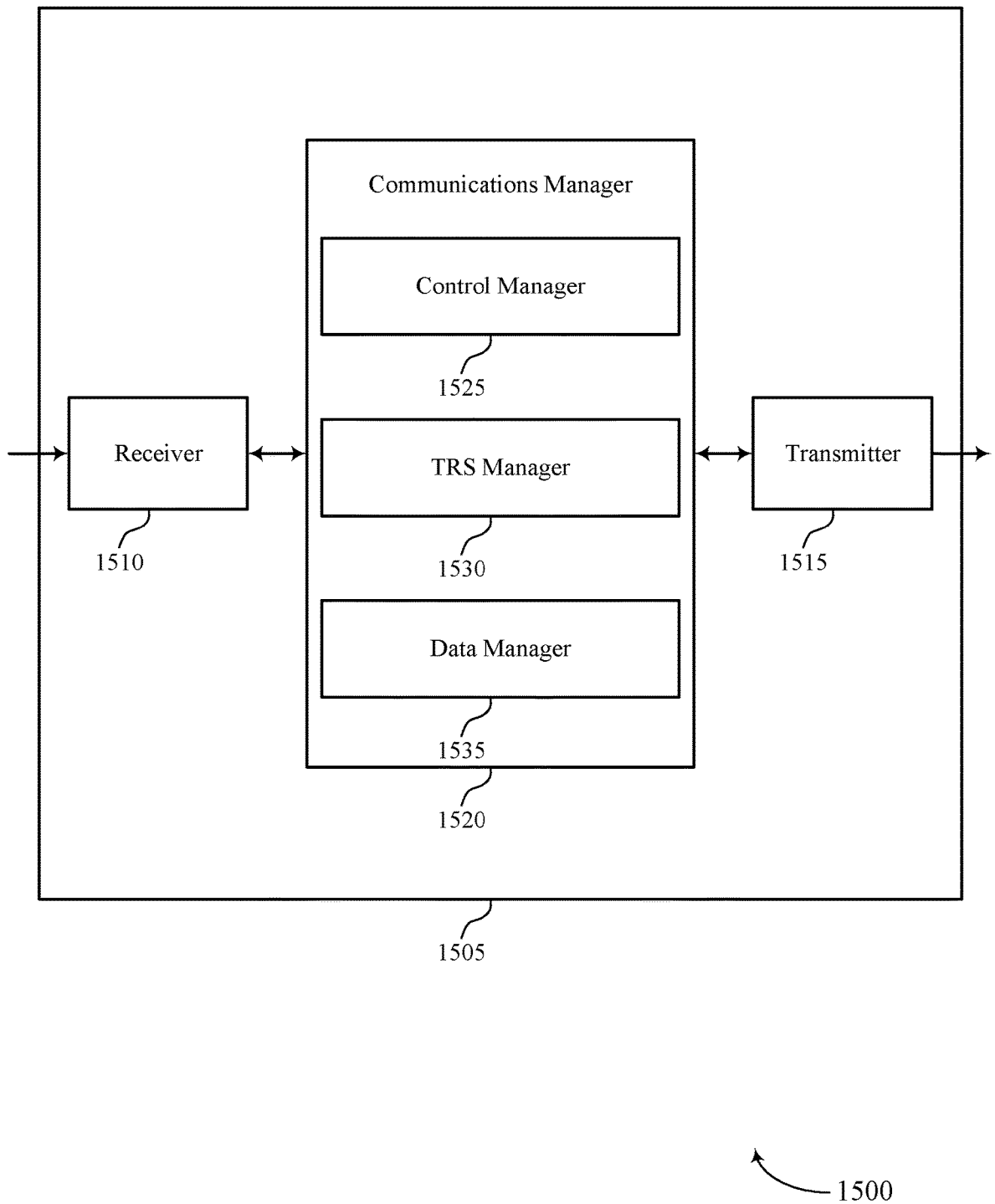

FIG. 15 shows a block diagram 1500 of a device 1505 that supports automatic gain control for super-high order modulations in accordance with one or more aspects of the present disclosure. The device 1505 may be an example of aspects of a device 1405 or a network entity 105 as described herein. The device 1505 may include a receiver 1510, a transmitter 1515, and a communications manager 1520. The device 1505 may also include a processor. Each of these components may be in communication with one another (e.g., via one or more buses).

The receiver 1510 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1505. In some examples, the receiver 1510 may support obtaining information by receiving signals via one or more antennas. Additionally, or alternatively, the receiver 1510 may support obtaining information by receiving signals via one or more wired (e.g., electrical, fiber optic) interfaces, wireless interfaces, or any combination thereof.

The transmitter 1515 may provide a means for outputting (e.g., transmitting, providing, conveying, sending) information generated by other components of the device 1505. For example, the transmitter 1515 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1515 may support outputting information by transmitting signals via one or more antennas. Additionally, or alternatively, the transmitter 1515 may support outputting information by transmitting signals via one or more wired (e.g., electrical, fiber optic) interfaces, wireless interfaces, or any combination thereof. In some examples, the transmitter 1515 and the receiver 1510 may be co-located in a transceiver, which may include or be coupled with a modem.

The device 1505, or various components thereof, may be an example of means for performing various aspects of automatic gain control for super-high order modulations as described herein. For example, the communications manager 1520 may include a control manager 1525, an TRS manager 1530, a data manager 1535, or any combination thereof. The communications manager 1520 may be an example of aspects of a communications manager 1420 as described herein. In some examples, the communications manager 1520, or various components thereof, may be configured to perform various operations (e.g., receiving, obtaining, monitoring, outputting, transmitting) using or otherwise in cooperation with the receiver 1510, the transmitter 1515, or both. For example, the communications manager 1520 may receive information from the receiver 1510, send information to the transmitter 1515, or be integrated in combination with the receiver 1510, the transmitter 1515, or both to obtain information, output information, or perform various other operations as described herein.

The communications manager 1520 may support wireless communication at a network entity in accordance with examples as disclosed herein. The control manager 1525 may be configured as or otherwise support a means for transmitting a control message scheduling one or more data transmissions to a UE, the one or more data transmissions associated with a modulation order that satisfies a threshold modulation order. The TRS manager 1530 may be configured as or otherwise support a means for transmitting a tracking reference signal on a set of resources in a first slot, where the first slot is adjacent in time to a second slot associated with the one or more data transmissions, and the set of resources is based on the modulation order. The data manager 1535 may be configured as or otherwise support a means for transmitting the one or more data transmissions in the second slot in accordance with the control message and based on transmitting the tracking reference signal in the first slot.

Figure 16:
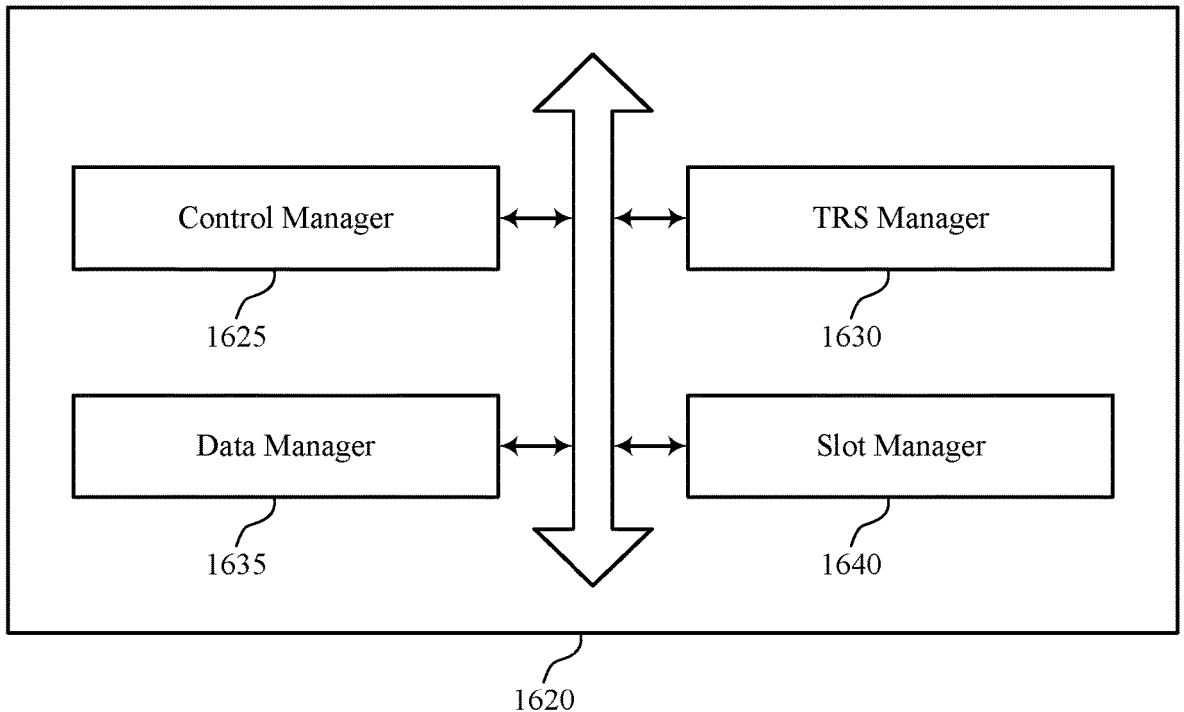
FIG. 16 shows a block diagram of a communications manager that supports automatic gain control for super-high order modulations in accordance with one or more aspects of the present disclosure.

FIG. 16 shows a block diagram 1600 of a communications manager 1620 that supports automatic gain control for super-high order modulations in accordance with one or more aspects of the present disclosure. The communications manager 1620 may be an example of aspects of a communications manager 1420, a communications manager 1520, or both, as described herein. The communications manager 1620, or various components thereof, may be an example of means for performing various aspects of automatic gain control for super-high order modulations as described herein. For example, the communications manager 1620 may include a control manager 1625, an TRS manager 1630, a data manager 1635, a slot manager 1640, or any combination thereof. Each of these components may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1620 may support wireless communication at a network entity in accordance with examples as disclosed herein. The control manager 1625 may be configured as or otherwise support a means for transmitting a control message scheduling one or more data transmissions to a UE, the one or more data transmissions associated with a modulation order that satisfies a threshold modulation order. The TRS manager 1630 may be configured as or otherwise support a means for transmitting a tracking reference signal on a set of resources in a first slot, where the first slot is adjacent in time to a second slot associated with the one or more data transmissions, and the set of resources is based on the modulation order. The data manager 1635 may be configured as or otherwise support a means for transmitting the one or more data transmissions in the second slot in accordance with the control message and based on transmitting the tracking reference signal in the first slot.

In some examples, the slot manager 1640 may be configured as or otherwise support a means for receiving, from the UE, a request for a network entity to transmit the one or more data transmissions in one or more shortened slots, where the second slot includes a shortened slot.

In some examples, the slot manager 1640 may be configured as or otherwise support a means for receiving, from the UE, an indication of a maximum quantity of continuous slots in which a network entity is to transmit the one or more data transmissions associated with the modulation order that satisfies the threshold modulation order.

In some examples, the TRS manager 1630 may be configured as or otherwise support a means for transmitting the tracking reference signal on a second set of resources in a third slot, where a quantity of continuous slots between the second slot and the third slot is less than or equal to the maximum quantity of continuous slots.

In some examples, a signal-to-noise ratio of the one or more data transmissions satisfies a signal-to-noise ratio requirement, the signal-to-noise ratio requirement being based on channel fading losses and analog-to-digital conversion losses.

In some examples, the tracking reference signal includes a periodic tracking reference signal.

Figure 17:
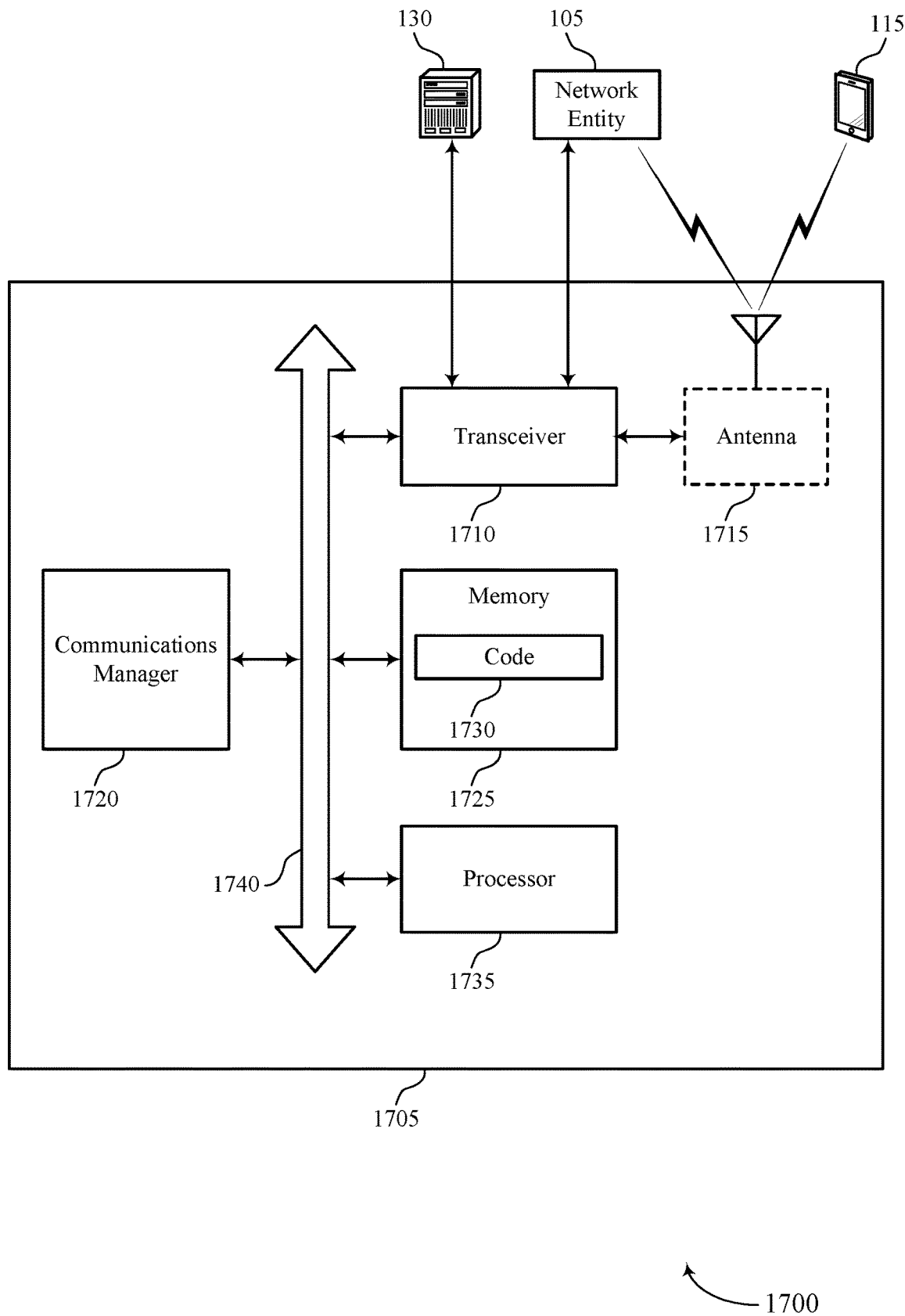
FIG. 17 shows a diagram of a system including a device that supports automatic gain control for super-high order modulations in accordance with one or more aspects of the present disclosure.

FIG. 17 shows a diagram of a system 1700 including a device 1705 that supports automatic gain control for super-high order modulations in accordance with one or more aspects of the present disclosure. The device 1705 may be an example of or include the components of a device 1405, a device 1505, or a network entity 105 as described herein. The device 1705 may communicate with one or more network entities 105, one or more UEs 115, or any combination thereof, which may include communications over one or more wired interfaces, over one or more wireless interfaces, or any combination thereof. The device 1705 may include components that support outputting and obtaining communications, such as a communications manager 1720, a transceiver 1710, an antenna 1715, a memory 1725, code 1730, and a processor 1735. These components may be in electronic communication or otherwise coupled (e.g., operatively, communicatively, functionally, electronically, electrically) via one or more buses (e.g., a bus 1740).

The transceiver 1710 may support bi-directional communications via wired links, wireless links, or both as described herein. In some examples, the transceiver 1710 may include a wired transceiver and may communicate bi-directionally with another wired transceiver. Additionally, or alternatively, in some examples, the transceiver 1710 may include a wireless transceiver and may communicate bi-directionally with another wireless transceiver. In some examples, the device 1705 may include one or more antennas 1715, which may be capable of transmitting or receiving wireless transmissions (e.g., concurrently). The transceiver 1710 may also include a modem to modulate signals, to provide the modulated signals for transmission (e.g., by one or more antennas 1715, by a wired transmitter), to receive modulated signals (e.g., from one or more antennas 1715, from a wired receiver), and to demodulate signals. The transceiver 1710, or the transceiver 1710 and one or more antennas 1715 or wired interfaces, where applicable, may be an example of a transmitter 1415, a transmitter 1515, a receiver 1410, a receiver 1510, or any combination thereof or component thereof, as described herein. In some examples, the transceiver may be operable to support communications via one or more communications links (e.g., a communication link 125, a backhaul communication link 120, a midhaul communication link 162, a fronthaul communication link 168).

The memory 1725 may include RAM and ROM. The memory 1725 may store computer-readable, computer-executable code 1730 including instructions that, when executed by the processor 1735, cause the device 1705 to perform various functions described herein. The code 1730 may be stored in a non-transitory computer-readable medium such as system memory or another type of memory. In some cases, the code 1730 may not be directly executable by the processor 1735 but may cause a computer (e.g., when compiled and executed) to perform functions described herein. In some cases, the memory 1725 may contain, among other things, a BIOS which may control basic hardware or software operation such as the interaction with peripheral components or devices.

The processor 1735 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the processor 1735 may be configured to operate a memory array using a memory controller. In some other cases, a memory controller may be integrated into the processor 1735. The processor 1735 may be configured to execute computer-readable instructions stored in a memory (e.g., the memory 1725) to cause the device 1705 to perform various functions (e.g., functions or tasks supporting automatic gain control for super-high order modulations). For example, the device 1705 or a component of the device 1705 may include a processor 1735 and memory 1725 coupled with the processor 1735, the processor 1735 and memory 1725 configured to perform various functions described herein. The processor 1735 may be an example of a cloud-computing platform (e.g., one or more physical nodes and supporting software such as operating systems, virtual machines, or container instances) that may host the functions (e.g., by executing code 1730) to perform the functions of the device 1705.

In some examples, a bus 1740 may support communications of (e.g., within) a protocol layer of a protocol stack. In some examples, a bus 1740 may support communications associated with a logical channel of a protocol stack (e.g., between protocol layers of a protocol stack), which may include communications performed within a component of the device 1705, or between different components of the device 1705 that may be co-located or located in different locations (e.g., where the device 1705 may refer to a system in which one or more of the communications manager 1720, the transceiver 1710, the memory 1725, the code 1730, and the processor 1735 may be located in one of the different components or divided between different components).

In some examples, the communications manager 1720 may manage aspects of communications with a core network 130 (e.g., via one or more wired or wireless backhaul links). For example, the communications manager 1720 may manage the transfer of data communications for client devices, such as one or more UEs 115. In some examples, the communications manager 1720 may manage communications with other network entities 105, and may include a controller or scheduler for controlling communications with UEs 115 in cooperation with other network entities 105. In some examples, the communications manager 1720 may support an X2 interface within an LTE/LTE-A wireless communications network technology to provide communication between network entities 105.

The communications manager 1720 may support wireless communication at a network entity in accordance with examples as disclosed herein. For example, the communications manager 1720 may be configured as or otherwise support a means for transmitting a control message scheduling one or more data transmissions to a UE, the one or more data transmissions associated with a modulation order that satisfies a threshold modulation order. The communications manager 1720 may be configured as or otherwise support a means for transmitting a tracking reference signal on a set of resources in a first slot, where the first slot is adjacent in time to a second slot associated with the one or more data transmissions, and the set of resources is based on the modulation order. The communications manager 1720 may be configured as or otherwise support a means for transmitting the one or more data transmissions in the second slot in accordance with the control message and based on transmitting the tracking reference signal in the first slot.

By including or configuring the communications manager 1720 in accordance with examples as described herein, the device 1705 may support techniques for more efficient utilization of communication resources. Because the device 1705 may allow a UE to adapt or consider a receiver gain when communicating with the device 1705, the device 1705 may be able to transmit data associated with super-high order modulations to the UE. As such, the device 1705 may transmit more data in a time resource (e.g., a slot), resulting in the more efficient utilization of communication resources.

In some examples, the communications manager 1720 may be configured to perform various operations (e.g., receiving, obtaining, monitoring, outputting, transmitting) using or otherwise in cooperation with the transceiver 1710, the one or more antennas 1715 (e.g., where applicable), or any combination thereof. Although the communications manager 1720 is illustrated as a separate component, in some examples, one or more functions described with reference to the communications manager 1720 may be supported by or performed by the processor 1735, the memory 1725, the code 1730, the transceiver 1710, or any combination thereof. For example, the code 1730 may include instructions executable by the processor 1735 to cause the device 1705 to perform various aspects of automatic gain control for super-high order modulations as described herein, or the processor 1735 and the memory 1725 may be otherwise configured to perform or support such operations.

Figure 18:
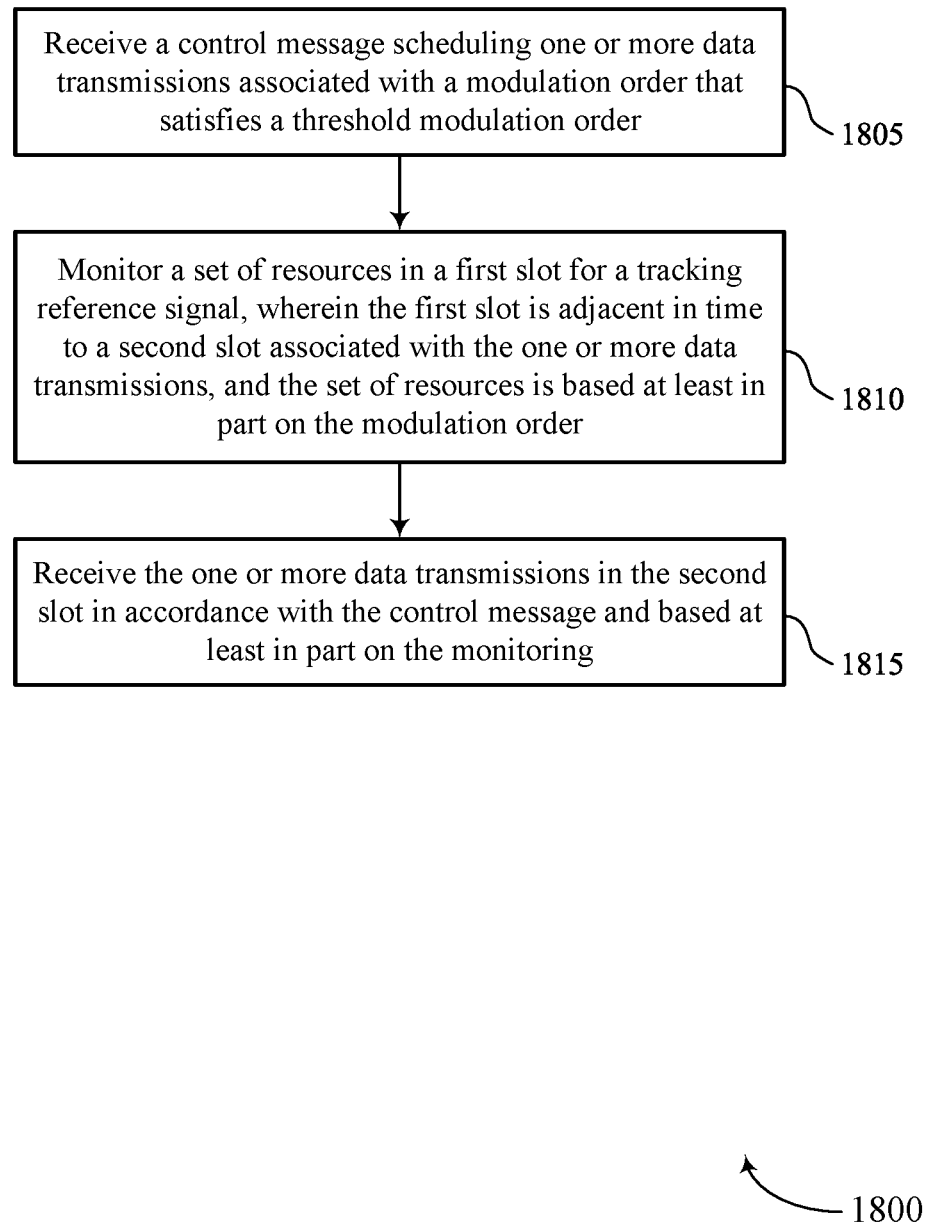
FIGS. 18 and 19 show flowcharts illustrating methods that support automatic gain control for super-high order modulations in accordance with one or more aspects of the present disclosure.

FIG. 18 shows a flowchart illustrating a method 1800 that supports automatic gain control for super-high order modulations in accordance with one or more aspects of the present disclosure. The operations of the method 1800 may be implemented by a UE or its components as described herein. For example, the operations of the method 1800 may be performed by a UE 115 as described with reference to FIGS. 1 through 13. In some examples, a UE may execute a set of instructions to control the functional elements of the UE to perform the described functions. Additionally, or alternatively, the UE may perform aspects of the described functions using special-purpose hardware.

At 1805, the method may include receiving a control message scheduling one or more data transmissions associated with a modulation order that satisfies a threshold modulation order. The operations of 1805 may be performed in accordance with examples as disclosed herein. In some examples, aspects of the operations of 1805 may be performed by a control manager 1225 as described with reference to FIG. 12.

At 1810, the method may include monitoring a set of resources in a first slot for a tracking reference signal, where the first slot is adjacent in time to a second slot associated with the one or more data transmissions, and the set of resources is based on the modulation order. The operations of 1810 may be performed in accordance with examples as disclosed herein. In some examples, aspects of the operations of 1810 may be performed by an TRS manager 1230 as described with reference to FIG. 12.

At 1815, the method may include receiving the one or more data transmissions in the second slot in accordance with the control message and based on the monitoring. The operations of 1815 may be performed in accordance with examples as disclosed herein. In some examples, aspects of the operations of 1815 may be performed by a data manager 1235 as described with reference to FIG. 12.

Figure 19:
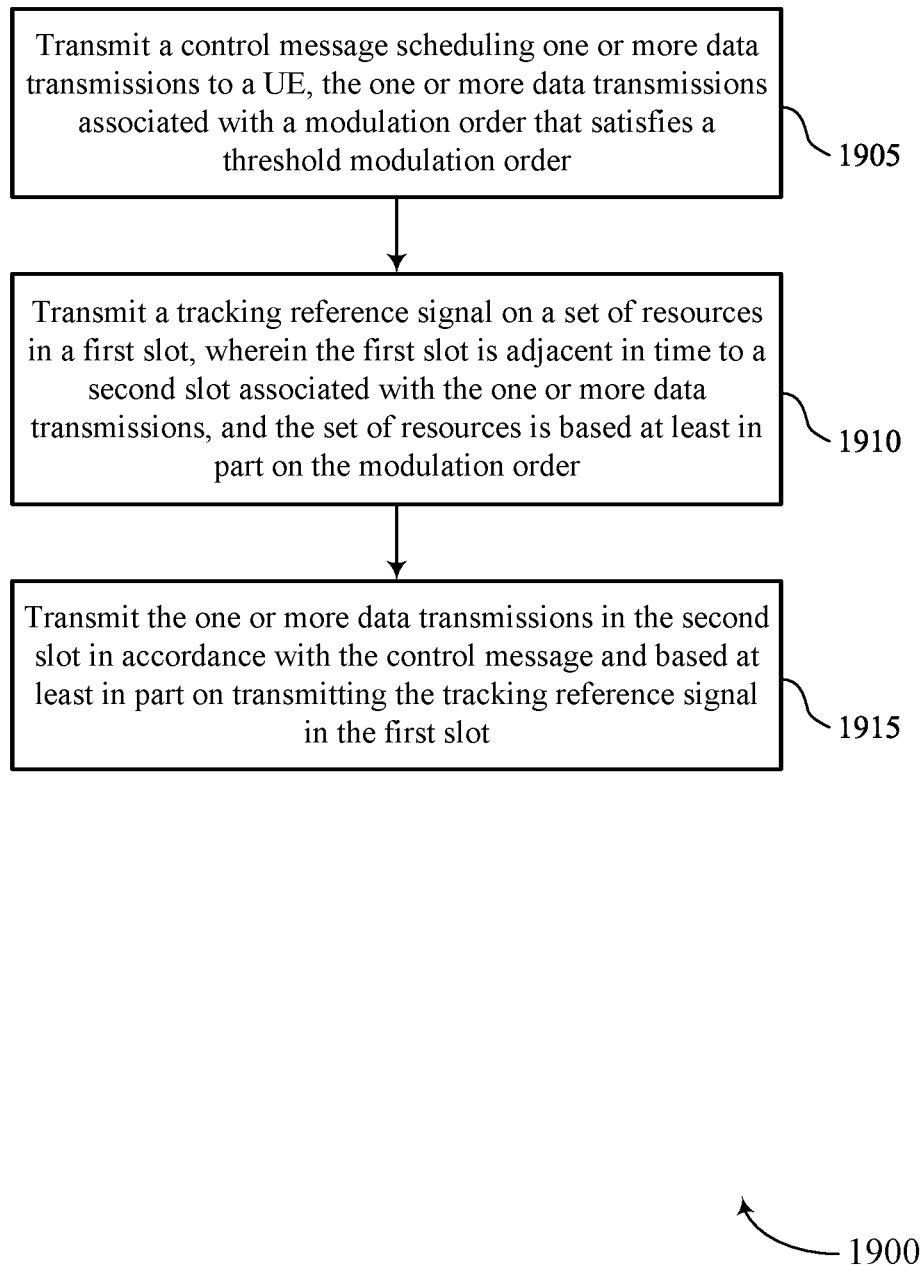

FIG. 19 shows a flowchart illustrating a method 1900 that supports automatic gain control for super-high order modulations in accordance with one or more aspects of the present disclosure. The operations of the method 1900 may be implemented by a network entity or its components as described herein. For example, the operations of the method 1900 may be performed by a network entity as described with reference to FIGS. 1 through 9 and 14 through 17. In some examples, a network entity may execute a set of instructions to control the functional elements of the network entity to perform the described functions. Additionally, or alternatively, the network entity may perform aspects of the described functions using special-purpose hardware.

At 1905, the method may include transmitting a control message scheduling one or more data transmissions to a UE, the one or more data transmissions associated with a modulation order that satisfies a threshold modulation order. The operations of 1905 may be performed in accordance with examples as disclosed herein. In some examples, aspects of the operations of 1905 may be performed by a control manager 1625 as described with reference to FIG. 16.

At 1910, the method may include transmitting a tracking reference signal on a set of resources in a first slot, where the first slot is adjacent in time to a second slot associated with the one or more data transmissions, and the set of resources is based on the modulation order. The operations of 1910 may be performed in accordance with examples as disclosed herein. In some examples, aspects of the operations of 1910 may be performed by an TRS manager 1630 as described with reference to FIG. 16.

At 1915, the method may include transmitting the one or more data transmissions in the second slot in accordance with the control message and based on transmitting the tracking reference signal in the first slot. The operations of 1915 may be performed in accordance with examples as disclosed herein. In some examples, aspects of the operations of 1915 may be performed by a data manager 1635 as described with reference to FIG. 16.

The following provides an overview of aspects of the present disclosure:

Aspect 1: A method for wireless communication at a UE, comprising: receiving a control message scheduling one or more data transmissions associated with a modulation order that satisfies a threshold modulation order; monitoring a set of resources in a first slot for a tracking reference signal, wherein the first slot is adjacent in time to a second slot associated with the one or more data transmissions, and the set of resources is based at least in part on the modulation order; and receiving the one or more data transmissions in the second slot in accordance with the control message and based at least in part on the monitoring.

Aspect 2: The method of aspect 1, further comprising: transmitting, based at least in part on a Doppler spread estimation at the UE or a speed of the UE satisfying a threshold, a request for the network entity to transmit the one or more data transmissions in one or more shortened slots, wherein the second slot comprises a shortened slot.

Aspect 3: The method of any of aspects 1 through 2, further comprising: transmitting an indication of a maximum quantity of continuous slots in which the network entity is to transmit the one or more data transmissions associated with the modulation order that satisfies the threshold modulation order.

Aspect 4: The method of aspect 3, further comprising: identifying the maximum quantity of continuous slots based at least in part on a Doppler spread estimation at the UE, a speed of the UE, the modulation order associated with the one or more data transmissions, or a combination thereof.

Aspect 5: The method of aspect 4, wherein the maximum quantity of continuous slots is inversely proportional to the Doppler spread estimation at the UE, the speed of the UE, and the modulation order associated with the one or more data transmissions.

Aspect 6: The method of any of aspects 3 through 5, further comprising: monitoring a second set of resources in a third slot for the tracking reference signal, wherein a quantity of continuous slots between the second slot and the third slot is less than or equal to the maximum quantity of continuous slots.

Aspect 7: The method of any of aspects 1 through 6, wherein a signal-to-noise ratio of the one or more data transmissions satisfies a signal-to-noise ratio requirement, the signal-to-noise ratio requirement being based at least in part on channel fading losses and analog-to-digital conversion losses.

Aspect 8: The method of any of aspects 1 through 7, wherein the tracking reference signal comprises a periodic tracking reference signal.

Aspect 9: The method of any of aspects 1 through 8, further comprising: performing automatic gain control to adjust a receiver gain of the UE based at least in part on the monitoring, wherein the one or more data transmissions are received in the second slot using the adjusted receiver gain.

Aspect 10: A method for wireless communication at a network entity, comprising: transmitting a control message scheduling one or more data transmissions to a UE, the one or more data transmissions associated with a modulation order that satisfies a threshold modulation order; transmitting a tracking reference signal on a set of resources in a first slot, wherein the first slot is adjacent in time to a second slot associated with the one or more data transmissions, and the set of resources is based at least in part on the modulation order; and transmitting the one or more data transmissions in the second slot in accordance with the control message and based at least in part on transmitting the tracking reference signal in the first slot.

Aspect 11: The method of aspect 10, further comprising: receiving, from the UE, a request for the network entity to transmit the one or more data transmissions in one or more shortened slots, wherein the second slot comprises a shortened slot.

Aspect 12: The method of any of aspects 10 through 11, further comprising: receiving, from the UE, an indication of a maximum quantity of continuous slots in which the network entity is to transmit the one or more data transmissions associated with the modulation order that satisfies the threshold modulation order.

Aspect 13: The method of aspect 12, further comprising: transmitting the tracking reference signal on a second set of resources in a third slot, wherein a quantity of continuous slots between the second slot and the third slot is less than or equal to the maximum quantity of continuous slots.

Aspect 14: The method of any of aspects 10 through 13, wherein a signal-to-noise ratio of the one or more data transmissions satisfies a signal-to-noise ratio requirement, the signal-to-noise ratio requirement being based at least in part on channel fading losses and analog-to-digital conversion losses.

Aspect 15: The method of any of aspects 10 through 14, wherein the tracking reference signal comprises a periodic tracking reference signal.

Aspect 16: An apparatus for wireless communication at a UE, comprising a processor; memory coupled with the processor; and instructions stored in the memory and executable by the processor to cause the apparatus to perform a method of any of aspects 1 through 9.

Aspect 17: An apparatus for wireless communication at a UE, comprising at least one means for performing a method of any of aspects 1 through 9.

Aspect 18: A non-transitory computer-readable medium storing code for wireless communication at a UE, the code comprising instructions executable by a processor to perform a method of any of aspects 1 through 9.

Aspect 19: An apparatus for wireless communication at a network entity, comprising a processor; memory coupled with the processor; and instructions stored in the memory and executable by the processor to cause the apparatus to perform a method of any of aspects 10 through 15.

Aspect 20: An apparatus for wireless communication at a network entity, comprising at least one means for performing a method of any of aspects 10 through 15.

Aspect 21: A non-transitory computer-readable medium storing code for wireless communication at a network entity, the code comprising instructions executable by a processor to perform a method of any of aspects 10 through 15.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communication at a user equipment (UE), comprising:
   one or more processors;
   one or more memories coupled with the one or more processors; and
   instructions stored in the one or more memories and executable by the one or more processors to cause the apparatus to:
      receive a control message scheduling one or more data transmissions associated with a modulation order that satisfies a threshold modulation order;
      monitor a set of resources in a first slot for a tracking reference signal, wherein the first slot is adjacent in time to a second slot associated with the one or more data transmissions, and the set of resources is based at least in part on the modulation order; and
      receive the one or more data transmissions in the second slot in accordance with the control message and based at least in part on the monitoring.

2. The apparatus of claim 1, wherein the instructions are further executable by the one or more processors to cause the apparatus to:
   transmit, based at least in part on a Doppler spread estimation at the UE or a speed of the UE satisfying a threshold, a request for a network entity to transmit the one or more data transmissions in one or more shortened slots, wherein the second slot comprises a shortened slot.

3. The apparatus of claim 1, wherein the instructions are further executable by the one or more processors to cause the apparatus to:
   transmit an indication of a maximum quantity of continuous slots in which a network entity is to transmit the one or more data transmissions associated with the modulation order that satisfies the threshold modulation order.

4. The apparatus of claim 3, wherein the instructions are further executable by the one or more processors to cause the apparatus to:
identify the maximum quantity of continuous slots based at least in part on a Doppler spread estimation at the UE, a speed of the UE, the modulation order associated with the one or more data transmissions, or a combination thereof.

5. The apparatus of claim 4, wherein the maximum quantity of continuous slots is inversely proportional to the Doppler spread estimation at the UE, the speed of the UE, and the modulation order associated with the one or more data transmissions.

6. The apparatus of claim 3, wherein the instructions are further executable by the one or more processors to cause the apparatus to:
monitor a second set of resources in a third slot for the tracking reference signal, wherein a quantity of continuous slots between the second slot and the third slot is less than or equal to the maximum quantity of continuous slots.

7. The apparatus of claim 1, wherein a signal-to-noise ratio of the one or more data transmissions satisfies a signal-to-noise ratio requirement, the signal-to-noise ratio requirement being based at least in part on channel fading losses and analog-to-digital conversion losses.

8. The apparatus of claim 1, wherein the tracking reference signal comprises a periodic tracking reference signal.

9. The apparatus of claim 1, wherein the instructions are further executable by the one or more processors to cause the apparatus to:
perform automatic gain control to adjust a receiver gain of the UE based at least in part on the monitoring, wherein the one or more data transmissions are received in the second slot using the adjusted receiver gain.

10. An apparatus for wireless communication at a network entity, comprising:
one or more processors;
one or more memories coupled with the one or more processors; and
instructions stored in the one or more memories and executable by the one or more processors to cause the apparatus to:
transmit a control message scheduling one or more data transmissions to a user equipment (UE), the one or more data transmissions associated with a modulation order that satisfies a threshold modulation order;
transmit a tracking reference signal on a set of resources in a first slot, wherein the first slot is adjacent in time to a second slot associated with the one or more data transmissions, and the set of resources is based at least in part on the modulation order; and
transmit the one or more data transmissions in the second slot in accordance with the control message and based at least in part on transmitting the tracking reference signal in the first slot.

11. The apparatus of claim 10, wherein the instructions are further executable by the one or more processors to cause the apparatus to:
receive, from the UE, a request for the network entity to transmit the one or more data transmissions in one or more shortened slots, wherein the second slot comprises a shortened slot.

12. The apparatus of claim 10, wherein the instructions are further executable by the one or more processors to cause the apparatus to:
receive, from the UE, an indication of a maximum quantity of continuous slots in which the network entity is to transmit the one or more data transmissions associated with the modulation order that satisfies the threshold modulation order.

13. The apparatus of claim 12, wherein the instructions are further executable by the one or more processors to cause the apparatus to:
transmit the tracking reference signal on a second set of resources in a third slot, wherein a quantity of continuous slots between the second slot and the third slot is less than or equal to the maximum quantity of continuous slots.

14. The apparatus of claim 10, wherein a signal-to-noise ratio of the one or more data transmissions satisfies a signal-to-noise ratio requirement, the signal-to-noise ratio requirement being based at least in part on channel fading losses and analog-to-digital conversion losses.

15. The apparatus of claim 10, wherein the tracking reference signal comprises a periodic tracking reference signal.

16. A method for wireless communication at a user equipment (UE), comprising:
receiving a control message scheduling one or more data transmissions associated with a modulation order that satisfies a threshold modulation order;
monitoring a set of resources in a first slot for a tracking reference signal, wherein the first slot is adjacent in time to a second slot associated with the one or more data transmissions, and the set of resources is based at least in part on the modulation order; and
receiving the one or more data transmissions in the second slot in accordance with the control message and based at least in part on the monitoring.

17. The method of claim 16, further comprising:
transmitting, based at least in part on a Doppler spread estimation at the UE or a speed of the UE satisfying a threshold, a request for a network entity to transmit the one or more data transmissions in one or more shortened slots, wherein the second slot comprises a shortened slot.

18. The method of claim 16, further comprising:
transmitting an indication of a maximum quantity of continuous slots in which a network entity is to transmit the one or more data transmissions associated with the modulation order that satisfies the threshold modulation order.

19. The method of claim 18, further comprising:
identifying the maximum quantity of continuous slots based at least in part on a Doppler spread estimation at the UE, a speed of the UE, the modulation order associated with the one or more data transmissions, or a combination thereof.

20. The method of claim 19, wherein the maximum quantity of continuous slots is inversely proportional to the Doppler spread estimation at the UE, the speed of the UE, and the modulation order associated with the one or more data transmissions.

21. The method of claim 18, further comprising:
monitoring a second set of resources in a third slot for the tracking reference signal, wherein a quantity of continuous slots between the second slot and the third slot is less than or equal to the maximum quantity of continuous slots.

22. The method of claim 16, wherein a signal-to-noise ratio of the one or more data transmissions satisfies a signal-to-noise ratio requirement, the signal-to-noise ratio requirement being based at least in part on channel fading losses and analog-to-digital conversion losses.

23. The method of claim 16, wherein the tracking reference signal comprises a periodic tracking reference signal.

24. The method of claim 16, further comprising:
performing automatic gain control to adjust a receiver gain of the UE based at least in part on the monitoring, wherein the one or more data transmissions are received in the second slot using the adjusted receiver gain.

25. A method for wireless communication at a network entity, comprising:
transmitting a control message scheduling one or more data transmissions to a user equipment (UE), the one or more data transmissions associated with a modulation order that satisfies a threshold modulation order;
transmitting a tracking reference signal on a set of resources in a first slot, wherein the first slot is adjacent in time to a second slot associated with the one or more data transmissions, and the set of resources is based at least in part on the modulation order; and
transmitting the one or more data transmissions in the second slot in accordance with the control message and based at least in part on transmitting the tracking reference signal in the first slot.

26. The method of claim 25, further comprising:
receiving, from the UE, a request for the network entity to transmit the one or more data transmissions in one or more shortened slots, wherein the second slot comprises a shortened slot.

27. The method of claim 25, further comprising:
receiving, from the UE, an indication of a maximum quantity of continuous slots in which the network entity is to transmit the one or more data transmissions associated with the modulation order that satisfies the threshold modulation order.

28. The method of claim 27, further comprising:
transmitting the tracking reference signal on a second set of resources in a third slot, wherein a quantity of continuous slots between the second slot and the third slot is less than or equal to the maximum quantity of continuous slots.

29. The method of claim 25, wherein a signal-to-noise ratio of the one or more data transmissions satisfies a signal-to-noise ratio requirement, the signal-to-noise ratio requirement being based at least in part on channel fading losses and analog-to-digital conversion losses.

30. The method of claim 25, wherein the tracking reference signal comprises a periodic tracking reference signal.

* * * * *